(12) United States Patent
Hirose et al.

(10) Patent No.: US 9,240,755 B2
(45) Date of Patent: Jan. 19, 2016

(54) OSCILLATOR CIRCUIT

(71) Applicant: NIHON DEMPA KOGYO CO., LTD., Tokyo (JP)

(72) Inventors: Masaki Hirose, Kanagawa (JP); Yukio Akazawa, Kanagawa (JP); Hiroki Hamaguchi, Kanagawa (JP); Takehito Ishii, Saitama (JP); Noritoshi Kimura, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 14/252,783

(22) Filed: Apr. 15, 2014

(65) Prior Publication Data

US 2014/0312984 A1 Oct. 23, 2014

(30) Foreign Application Priority Data

Apr. 17, 2013 (JP) ................................. 2013-086551
Apr. 17, 2013 (JP) ................................. 2013-086552

(51) Int. Cl.
*H03B 5/36* (2006.01)
*H03B 21/01* (2006.01)

(52) U.S. Cl.
CPC ................ *H03B 21/01* (2013.01); *H03B 5/366* (2013.01); *H03B 2201/02* (2013.01)

(58) Field of Classification Search
CPC .......... H03B 21/00; H03B 21/01; H03B 5/32; H03B 5/36; H03B 5/366; H03B 2201/02
USPC .......................... 331/162, 116 R, 116 FE, 158
See application file for complete search history.

(56) References Cited

U.S. PATENT DOCUMENTS

2008/0136542 A1* 6/2008 Hirama ..................... 331/116 R
2013/0027143 A1* 1/2013 Hirama ..................... 331/116 R

FOREIGN PATENT DOCUMENTS

JP 2007-295256 11/2007

* cited by examiner

*Primary Examiner* — Ryan Johnson
(74) *Attorney, Agent, or Firm* — Jianq Chyun IP Office

(57) ABSTRACT

An oscillator circuit includes a first resonator, a second resonator, and a frequency adjusting unit. The second resonator has a frequency characteristic different from a frequency characteristic of the first resonator. The frequency adjusting unit is configured to change a ratio between a contribution of the first resonator and a contribution of the second resonator so as to adjust an output frequency.

16 Claims, 20 Drawing Sheets

OSCILLATOR CIRCUIT

CROSS-REFERENCE TO RELATED APPLICATIONS

This application claims the priority benefit of Japan application serial no. 2013-086551, filed on Apr. 17, 2013, and claims the priority benefit of a Japan application serial no. 2013-086552, filed on Apr. 17, 2013. The entirety of each of the above-mentioned patent applications is hereby incorporated by reference herein and made a part of this specification.

TECHNICAL FIELD

This disclosure relates to an oscillator circuit that allows adjusting a frequency for oscillation.

DESCRIPTION OF THE RELATED ART

Conventionally, a known anti-resonance circuit employs a plurality of crystal resonators with different resonance frequencies to allow adjusting an anti-resonance frequency in a wider frequency range than a frequency range adjustable by a single crystal resonator, and a known oscillator circuit employs an anti-resonance circuit that allows adjusting an anti-resonance frequency in a wider frequency range than a frequency range adjustable by a single crystal resonator (for example, see Japanese Unexamined Patent Application Publication No. 2007-295256).

FIG. 25 illustrates a configuration example of a conventional anti-resonance circuit 400. In FIG. 25, the anti-resonance circuit 400 connects to an output resistor 440 and a load resistor 450 of an AC signal source 430.

The anti-resonance circuit 400 includes a crystal resonator 411 and a crystal resonator 421 that are connected to different paths between the output resistor 440 and the load resistor 450. In a first path connected to the crystal resonator 411, an attenuator 412, an inductor 413, and a capacitor 414 are disposed in series. The crystal resonator 411 connects to the connection point between the inductor 413 and the capacitor 414 and connects to the ground. Similarly, in a second path connected to the crystal resonator 421, an attenuator 422, an inductor 423, and a capacitor 424 are disposed in series. The crystal resonator 421 connects to the connection point between the inductor 423 and the capacitor 424 and connects to the ground.

The crystal resonator 411 and the crystal resonator 421 have mutually different resonance frequencies, and are connected to each other via the capacitor 414 and the capacitor 424. Accordingly, the anti-resonance circuit 400 has an anti-resonance (or resonance) at the frequency between the resonance frequency of the crystal resonator 411 and the resonance frequency of the crystal resonator 421. Changing the respective attenuation rates of the attenuator 412 and the attenuator 422 changes the resonance frequency (or the anti-resonance frequency) of the anti-resonance circuit 400. This anti-resonance circuit 400 is applied to a negative feedback path of an amplifier with a gain to form an oscillator circuit. Thus, the oscillation frequency is changed.

Incidentally, the resonance frequency of a resonator with a high Q, for example, a crystal resonator, or a micro-electromechanical systems (MEMS) resonator is expressed by $f_L = (1/2\pi)\sqrt{(C_1+C_L)/L_1 C_1 C_L}$. Here, $C_1$ denotes motional capacitance of the equivalent circuit of the resonator. $C_L$ denotes load capacitance. $L_1$ denotes motional inductance of the resonator.

In an oscillator circuit using a MEMS resonator with a relatively small $C_1$, a bias voltage applied to the resonator is adjusted to adjust the frequency. This is because the approximation of $f_L = (1/2\pi)\sqrt{(1/L_1 C_1)}$ can be performed based on the relationship of $C_L \gg C_1$ and the resonance frequency is determined based on $L_1$ and $C_1$ of the resonator in the case where the resonator with a very small $C_1$ is used in an oscillator circuit compared with a capacitance value in the order of several pF to be realized in an integrated circuit or a discrete component. Accordingly, in the case where the above-described resonator is used in an oscillator circuit, for example, in temperature compensation using $C_L$, the temperature characteristic of the resonance frequency of the resonator reflects directly to the temperature characteristic of the oscillation frequency.

Especially, the temperature characteristic of the resonance frequency of the MEMS resonator is approximately $-30$ ppm/° C., and the frequency change range with respect to the temperature change is relatively wide. Accordingly, in the oscillator circuit using the MEMS resonator, it is difficult to cancel the temperature change and obtain a stable oscillation frequency even with the frequency adjustment using the bias voltage.

The anti-resonance circuit 400 illustrated in FIG. 25 allows changing the anti-resonance frequency in a wider frequency range than a range of the case where the bias voltage of a single MEMS resonator is adjusted. However, in the anti-resonance circuit 400, it has been necessary to have sufficiently large inductance values of the inductor 413 and the inductor 423 so as to allow the oscillator circuit to employ a large Q value at the anti-resonance frequency. Specifically, in Japanese Unexamined Patent Application Publication No. 2007-295256, 27 µH is described as an example of the inductance values of the inductor 413 and the inductor 423.

However, the inductor has an inductance value that significantly changes corresponding to a temperature change. It is also difficult to adjust the inductance value corresponding to variation of the resonator. Accordingly, in the anti-resonance circuit (or the resonance circuit) using the inductor, it has been difficult to obtain a stable oscillation frequency. Furthermore, it has been difficult to incorporate an inductor with an inductance value in the order of µH in the integrated circuit. Accordingly, it has been difficult to mass-produce the oscillator circuit that allows obtaining an oscillation signal at a stable oscillation frequency using the conventional anti-resonance circuit 400 at low cost.

A need thus exists for an oscillator circuit which is not susceptible to the drawback mentioned above.

SUMMARY

An oscillator circuit according to the disclosure includes a first resonator, a second, and a frequency adjusting unit. The second resonator has a frequency characteristic different from a frequency characteristic of the first resonator. The frequency adjusting unit is configured to change a ratio between a contribution of the first resonator and a contribution of the second resonator so as to adjust an output frequency.

BRIEF DESCRIPTION OF THE DRAWINGS

The foregoing and additional features and characteristics of this disclosure will become more apparent from the following detailed description considered with reference to the accompanying drawings.

DETAILED DESCRIPTION

First Embodiment

Figure 1:
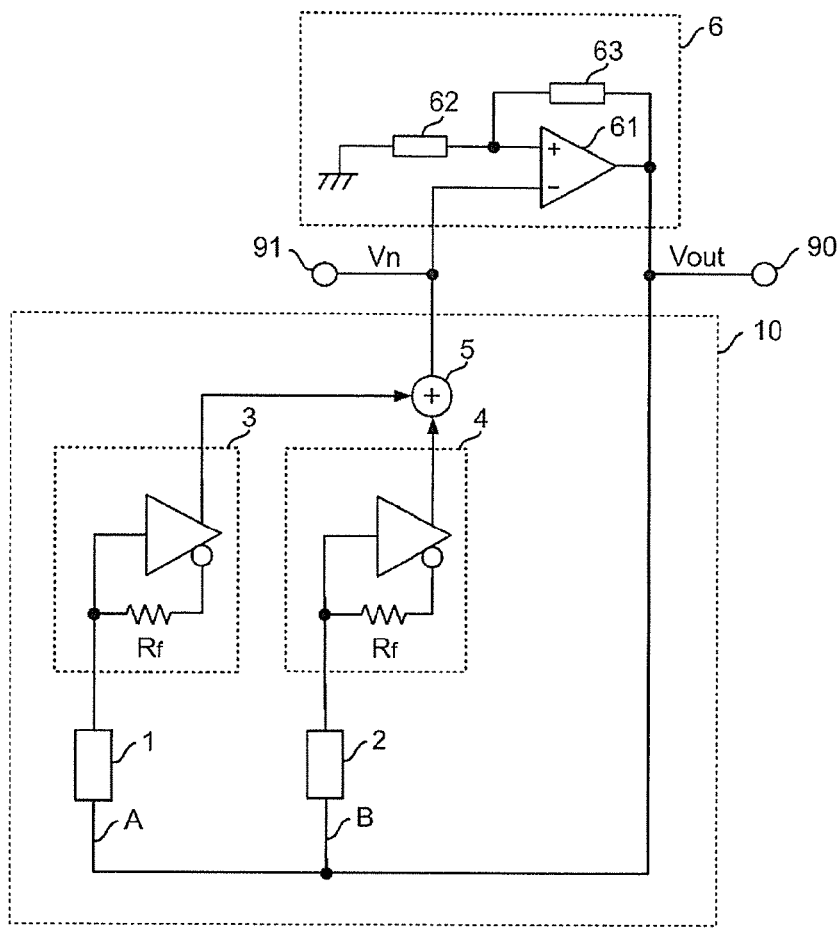
FIG. 1 illustrates a configuration example of an oscillator circuit according to a first embodiment.

FIG. 1 illustrates a configuration example of an oscillator circuit 100 of a first embodiment. The oscillator circuit 100 includes a first resonator 1, a second resonator 2, a first adjusting unit 3, a second adjusting unit 4, a converting unit 5, and an amplifying unit 6. The oscillator circuit 100 outputs an oscillation signal from an output terminal 90. The first resonator 1, the second resonator 2, the first adjusting unit 3, the second adjusting unit 4, and the converting unit 5 function as a notch filter 10 that does not allow passage of a signal at a predetermined frequency.

The first resonator 1 connects to the first adjusting unit 3 in series in a path A between the amplifying unit 6 and the first adjusting unit 3. The second resonator 2 connects to the second adjusting unit 4 in a path B between the amplifying unit 6 and the second adjusting unit 4. The anti-resonance frequency of the first resonator 1 and the anti-resonance frequency of the second resonator 2 are higher than the resonance frequency of the first resonator 1 and the resonance frequency of the second resonator 2. The oscillator circuit 100 allows changing the oscillation frequency in a frequency range from the anti-resonance frequency of the first resonator 1 to the anti-resonance frequency of the second resonator 2.

The first resonator 1 and the second resonator 2 each employ, for example, an AT-cut crystal resonator, an SC-cut crystal resonator, or an MEMS resonator. The first resonator 1 and the second resonator 2 have mutually different resonance frequencies (series resonance frequencies) and anti-resonance frequencies (parallel resonance frequencies). The first resonator 1 has a resonance frequency of $fr_1$ and an anti-resonance frequency of $fa_1$. The second resonator 2 has a resonance frequency of $fr_2$ and an anti-resonance frequency of $fa_2$.

The first adjusting unit 3 adjusts a first current value of a first current flowing between the output of the first adjusting unit 3 and the converting unit 5. The second adjusting unit 4 adjusts a second current value of a second current flowing between the output of the second adjusting unit 4 and the converting unit 5. The first adjusting unit 3 and the second adjusting unit 4 employ, for example, a feedback amplifier with a negative feedback resistor $R_f$. The respective amplification factors of the first adjusting unit 3 and the second adjusting unit 4 are adjusted by the value of the negative feedback resistor $R_f$.

The converting unit 5 converts the first current adjusted by the first adjusting unit 3 and the second current adjusted by the second adjusting unit 4 into a voltage corresponding to the first current value and the second current value. For example, the converting unit 5 converts the first current and the second current into the voltage corresponding to the summed value of the first current value and the second current value. The detailed configuration examples of the first adjusting unit 3, the second adjusting unit 4, and the converting unit 5 will be described later.

The amplifying unit 6 includes a differential amplifying unit 61, an impedance 62, and an impedance 63. The voltage converted from the first current and the second current by the converting unit 5 is input to the inverting input terminal of the differential amplifying unit 61. The impedance 62 connects to the non-inverting input terminal of the differential amplifying unit 61 and the ground. The impedance 63 connects to the non-inverting input terminal and the output terminal of the differential amplifying unit 61.

The amplifying unit 6 amplifies the voltage converted by the converting unit 5 and applies the amplified voltage to the first resonator 1 and the second resonator 2, so as to satisfy the oscillation condition of the oscillator circuit 100. That is, the amplifying unit 6 amplifies the voltage converted by the converting unit 5 and applies the amplified voltage to the first resonator 1 and the second resonator 2, so as to form an oscillation loop with a gain of 1 or more.

That is, the oscillator circuit 100 has a configuration in which the notch filter 10 is disposed in a negative feedback unit of the amplifying unit 6. The oscillator circuit 100 oscillates at a frequency from the anti-resonance frequency $fa_1$ of the first resonator 1 to the anti-resonance frequency $fa_2$ of the second resonator 2. Here, assuming that the output voltage of the output terminal 90 is denoted as Vout and the voltage of an inverting input terminal 91 of the differential amplifying unit 61 is denoted as Vn, the transfer characteristic of the notch filter 10 is expressed as below.

$$V_n = -AR_f V_{out} \left[ \frac{1}{R_f + (A+1)Z_1} + \frac{1}{R_f + (A+1)Z_2} \right] \quad \text{Formula (1)}$$

That is, there is the following relationship between Vn and Vout.

$$\frac{V_n}{V_{out}} \approx -R_f \left( \frac{1}{Z_1} + \frac{1}{Z_2} \right) \quad \text{Formula (2)}$$

Here, A denotes the open-loop gain in the first adjusting unit 3 and the second adjusting unit 4. $Z_1$ denotes the impedance of the first resonator 1. $Z_2$ denotes the impedance of the second resonator 2. $R_f$ denotes the feedback resistor value in the first adjusting unit 3 and the second adjusting unit 4.

For example, at the frequency at which any of the impedance $Z_1$ of the first resonator 1 and the impedance $Z_2$ of the second resonator 2 is larger than a predetermined value, the transfer characteristic is determined by $Z_1$ and $Z_2$. As is apparent from the above-described formula, the transfer characteristic of the notch filter 10 is determined by the respective values of the impedance $Z_1$ of the first resonator 1, the impedance $Z_2$ of the second resonator 2, the open-loop gain A in the first adjusting unit 3 and the second adjusting unit 4, and the negative feedback resistor $R_f$. Accordingly, the gain is obtained by the amplifying unit 6 at the frequency that satisfies the oscillation condition of the phase. Thus, the oscillation condition is satisfied. This shows that the oscillator circuit 100 allows outputting the oscillation signal without using an inductor having a large value that cannot be incorporated into the integrated circuit.

Figure 2:
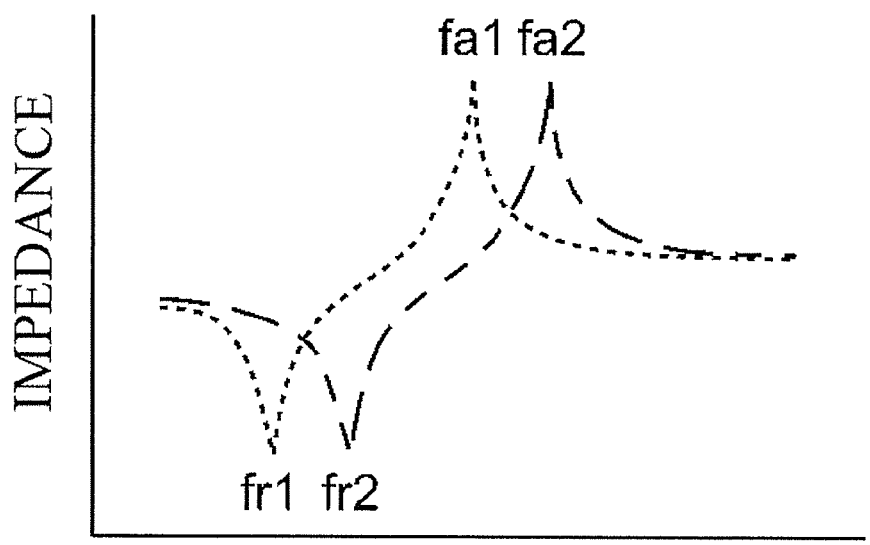
FIG. 2 illustrates respective frequency characteristics of impedances of a first resonator and a second resonator in a notch filter of the oscillator circuit according to the first embodiment.

FIG. 2 illustrates the respective frequency characteristics of the impedances of the first resonator 1 and the second resonator 2 in the notch filter 10 illustrated in FIG. 1. In FIG. 2, the dotted line denotes the frequency characteristic of the impedance of the first resonator 1 in the path A. The broken line denotes the frequency characteristic of the impedance of the second resonator 2 in the path B. The impedance of the first resonator 1 becomes maximum at the anti-resonance frequency $fa_1$ of the first resonator 1. The impedance of the second resonator 2 becomes maximum at the anti-resonance frequency $fa_2$ of the second resonator 2.

Accordingly, for example, in the case where the notch filter 10 does not include the second resonator 2 and the second adjusting unit 4, the oscillator circuit 100 oscillates at the anti-resonance frequency $fa_1$. In the case where the notch filter 10 does not include the first resonator 1 and the first adjusting unit 3, the oscillator circuit 100 oscillates at the anti-resonance frequency $fa_2$. In the case where the notch filter 10 includes the first resonator 1, the second resonator 2, the first adjusting unit 3, and the second adjusting unit 4, the impedance becomes maximum at a frequency $f_0$ between the anti-resonance frequency $fa_1$ and the anti-resonance frequency $fa_2$, so as to form a notch. The notch is inverted through the amplifying unit 6 so as to cause the oscillator circuit 100 to oscillate at the frequency $f_0$.

Figure 3:
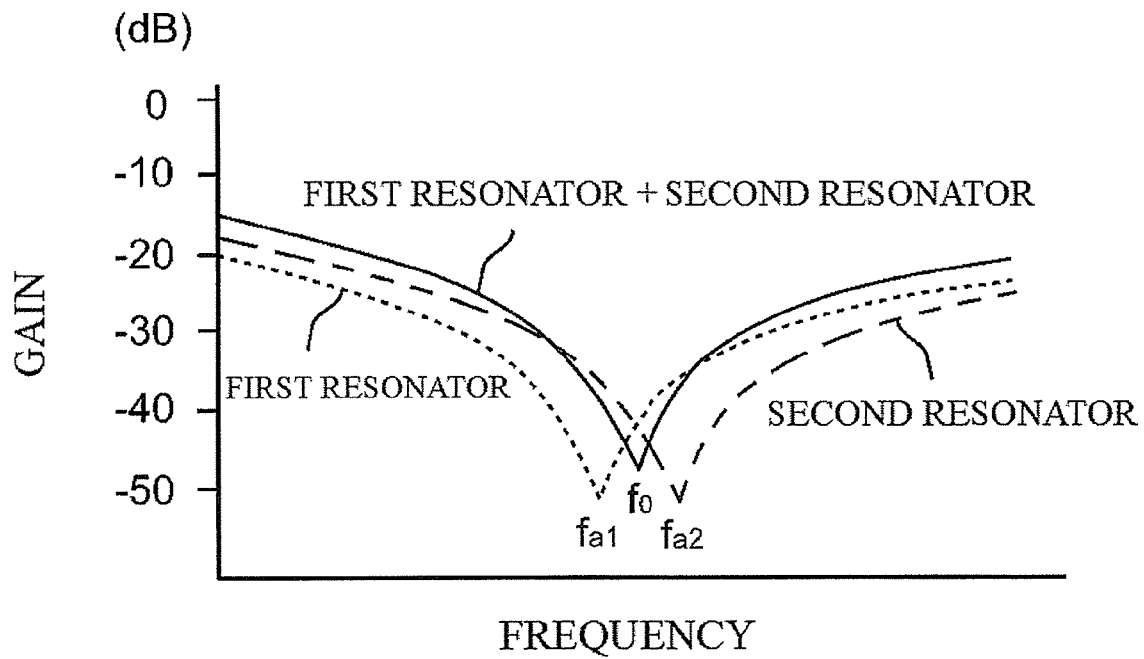
FIG. 3 illustrates gain characteristics of the notch filter.
Figure 4:
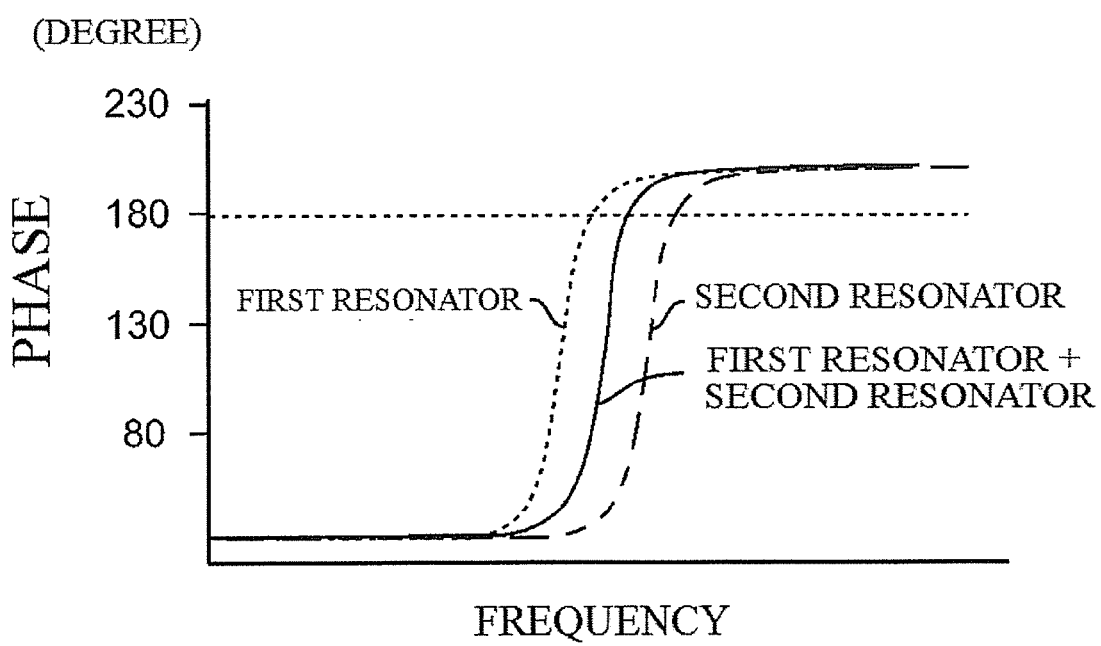
FIG. 4 illustrates phase characteristics of the notch filter.

FIG. 3 illustrates one example of the gain characteristic of the notch filter 10. FIG. 4 illustrates one example of the phase characteristic of the notch filter 10. In FIG. 3, the dotted line illustrates the frequency characteristic of the gain in the case where the notch filter 10 includes the first resonator 1 alone, and the broken line illustrates the frequency characteristic of the gain in the case where the notch filter 10 includes the second resonator 2 alone. The solid line illustrates the frequency characteristic of the gain in the case where the notch filter 10 includes the first resonator 1 and the second resonator 2. Similarly, in FIG. 4, the dotted line illustrates the frequency characteristic of the phase in the case where the notch filter 10 includes the first resonator 1 alone, and the broken line illustrates the frequency characteristic of the phase in the case where the notch filter 10 includes the second resonator 2 alone. The solid line illustrates the frequency characteristic of the phase in the case where the notch filter 10 includes the first resonator 1 and the second resonator 2.

For example, the anti-resonance frequency $fa_1$ of the first resonator 1 is 4.10 MHz and the anti-resonance frequency $fa_2$ of the second resonator 2 is 4.11 MHz. In this case, the gain in the case where the notch filter 10 includes the first resonator 1 and the second resonator 2 becomes minimum at 4.105 MHz. For example, in the case where the notch filter 10 includes the first resonator 1 alone, the frequency at which the phase is changed by 180 degrees is 4.103 MHz. In the case where the notch filter 10 includes the second resonator 2 alone, the frequency at which the phase is changed by 180 degrees is 4.113 MHz. In the case where the notch filter 10 includes the first resonator 1 and the second resonator 2, the frequency at which the phase is changed by 180 degrees is 4.108 MHz. In the case where the notch filter 10 includes the first resonator 1 and the second resonator 2, the phase of the notch filter 10 becomes 180 degrees at a frequency of 4.108 MHz. Thus, applying this signal to the amplifying unit 6 as a negative feedback signal causes a phase of 360 degrees and a loop gain of 1 or more so as to satisfy the oscillation condition. Accordingly, it is found that the oscillator circuit 100 oscillates at a frequency from the anti-resonance frequency of the first resonator 1 to the anti-resonance frequency of the second resonator 2.

Figure 5:
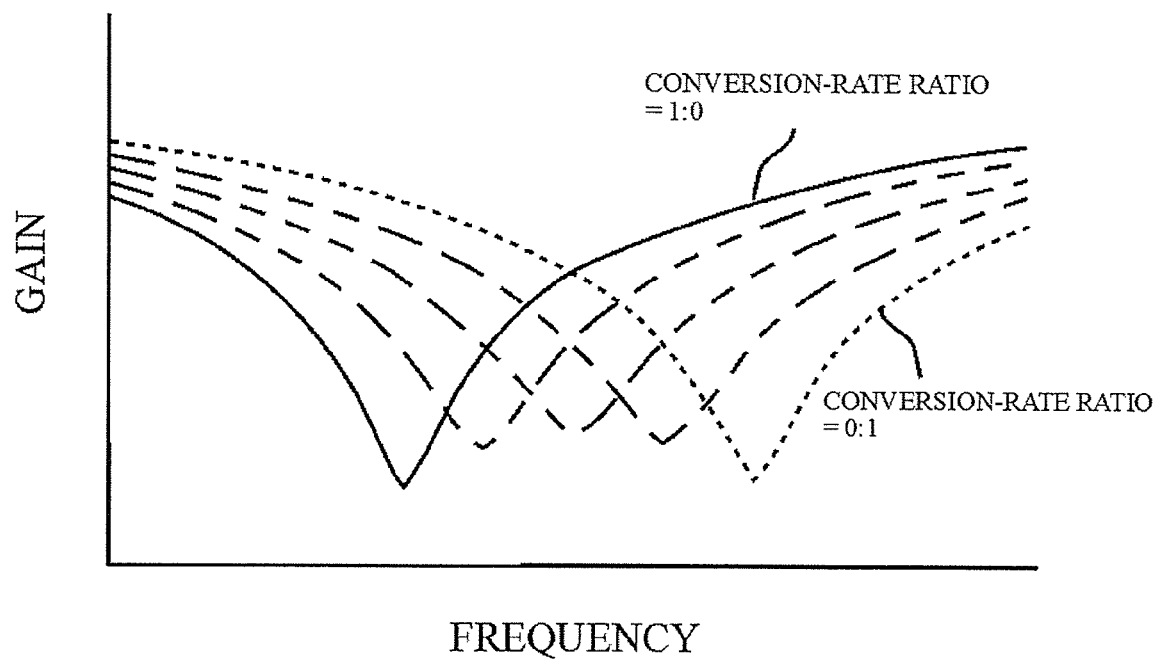
FIG. 5 illustrates frequency characteristics of the gain of the notch filter.

FIG. 5 illustrates the frequency characteristic of the gain of the notch filter 10 with a constant sum of the voltage-current conversion rate of a transistor used in the first adjusting unit 3 and the voltage-current conversion rate of a transistor used in the second adjusting unit 4 in the case where the ratio (hereinafter referred to as a conversion-rate ratio) between the voltage-current conversion rate of the transistor used in the first adjusting unit 3 and the voltage-current conversion rate of the transistor used in the second adjusting unit 4 is changed. In FIG. 5, the solid line illustrates the case where the conversion-rate ratio is 1:0. The dotted line illustrates the case where the conversion-rate ratio is 0:1. The broken lines illustrate the case where the conversion-rate ratio is between 1:0 and 0:1. It is found that changing the ratio between the voltage-current conversion rate of the transistor used in the first adjusting unit 3 and the voltage-current conversion rate of the transistor used in the second adjusting unit 4 changes the degree of contribution of the respective notch characteristics of the first adjusting unit 3 and the second adjusting unit 4. This changes the anti-resonance frequency between the anti-resonance frequency of the first resonator 1 and the anti-resonance frequency of the second resonator 2.

Figure 6A:
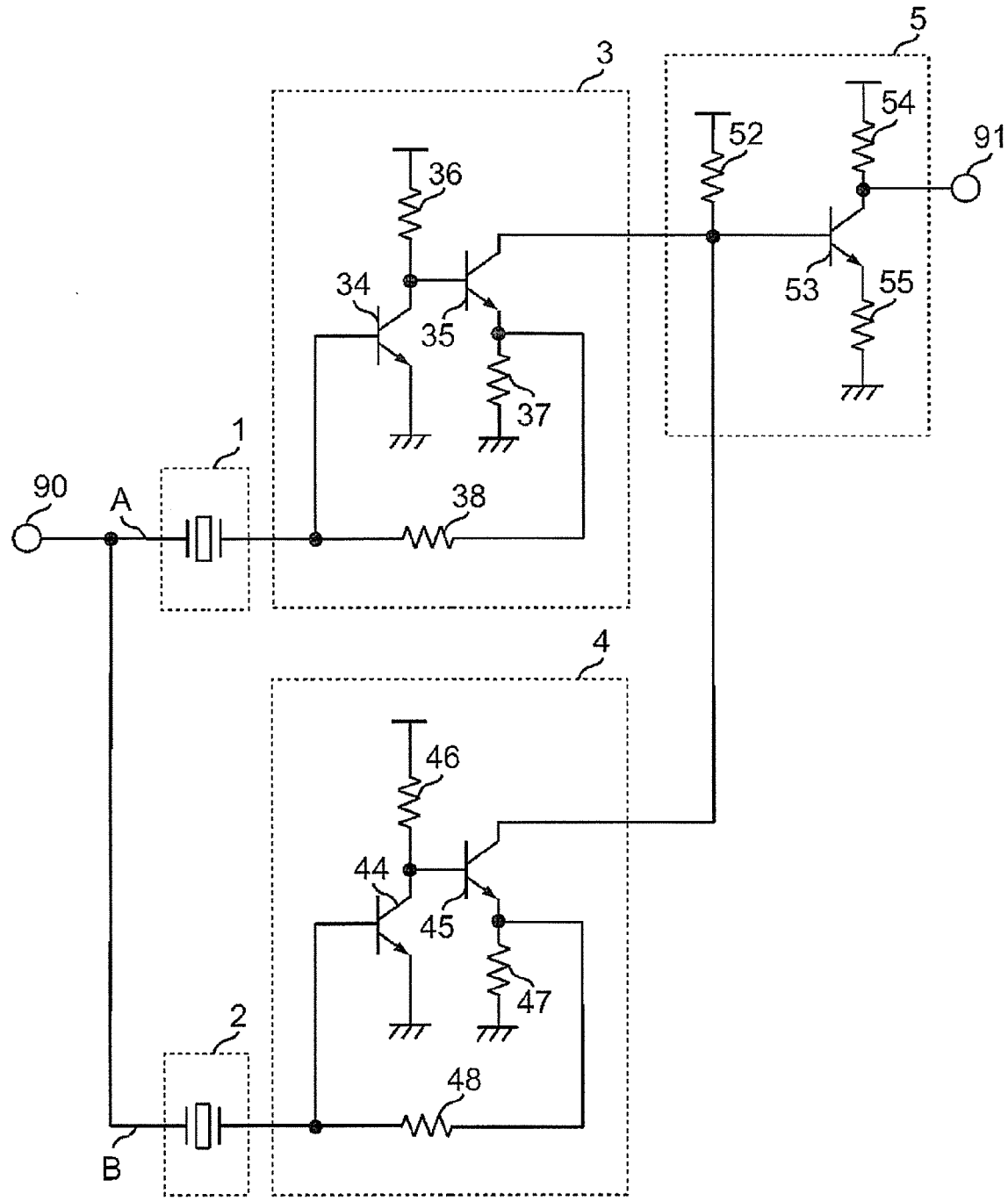
FIG. 6A illustrates a circuit configuration example of the notch filter.

FIG. 6A illustrates a circuit configuration example of the notch filter 10. The first adjusting unit 3 includes a transistor 35 and a resistor 37. The transistor 35 functions as a first transistor that causes the flow of the first current. The resistor 37 functions as a first variable resistor for adjusting the first current value. Specifically, the first adjusting unit 3 includes a transistor 34, the transistor 35, a resistor 36, the resistor 37, and a resistor 38. The resistor 38 corresponds to the feedback resistor $R_f$ in the first adjusting unit 3 illustrated in FIG. 1. The amplification factor of the first adjusting unit 3 is determined mainly by the resistor 38.

The base of the transistor 34 and one end of the resistor 38 connect to the first resonator 1. The emitter of the transistor 34 connects to the ground. The collector of the transistor 34 connects to the base of the transistor 35 and connects to a power source via the resistor 36. The emitter of the transistor 35 connects to the other end of the resistor 38 and connects to the round via the resistor 37. The collector of the transistor 35 connects to a power source via a resistor 52 included in the converting unit 5, and connects to the collector of a transistor 45 and the base of a transistor 53.

Similarly, the second adjusting unit 4 includes the transistor 45 and a resistor 47. The transistor 45 functions as a second transistor that causes a flow of the second current. The resistor 47 functions as a second variable resistor for adjusting the second current value. Specifically, the second adjusting unit 4 includes a transistor 44, the transistor 45, a resistor 46, the resistor 47, and a resistor 48. The resistor 48 corresponds to the feedback resistor $R_f$ in the second adjusting unit 4 illustrated in FIG. 1. The amplification factor of the second adjusting unit 4 is determined mainly by the resistor 48.

The base of the transistor 44 and one end of the resistor 48 connect to the second resonator 2. The emitter of the transistor 44 connects to the ground. The collector of the transistor 44 connects to the base of the transistor 45 and connects to the power source via the resistor 46. The emitter of the transistor 45 connects to the other end of the resistor 48 and connects to the ground via the resistor 47. The collector of the transistor 45 connects to the power source via the resistor 52 included in the converting unit 5, and connects to the collector of the transistor 35 and the base of the transistor 53.

The converting unit 5 includes the resistor 52, the transistor 53, a resistor 54, and a resistor 55. The base of the transistor 53 receives a base voltage determined based on the first current flowing through the collector of the transistor 35 and the second current flowing through the collector of the transistor 45.

Hereinafter, a description will be given of the operation of the notch filter 10 in FIG. 6A. To the first adjusting unit 3, a resonator current $i_1$ flows from the first resonator 1. To the second adjusting unit 4, a resonator current $i_2$ flows from the second resonator 2.

Here, $R_{21}$ denotes the resistance value of the resistor 37. $R_{f1}$ denotes the resistance value of the resistor 38. $R_{22}$ denotes the resistance value of the resistor 47. $R_{f2}$ denotes the resistance value of the resistor 48. In this case, when the resonator current $i_1$ flows into the first adjusting unit 3, a current $i_{op1}$ flows through the collector of the transistor 35 via the resistor 52. The current $i_{op1}$ is $R_{f1}/R_{21}$ times as large as the resonator current $i_1$. When the resonator current $i_2$ flows into the second adjusting unit 4, a current $i_{op2}$ flows through the collector of the transistor 45 via the resistor 52. The current $i_{op2}$ is $Rn/R_{22}$ times as large as the resonator current $i_2$. The current $i_{op1}$ and the current $i_{op2}$ flow through the resistor 52 and are synthesized. The synthesized current is converted into a voltage and input to the amplifying unit 6 illustrated in FIG. 1.

Figure 6B:
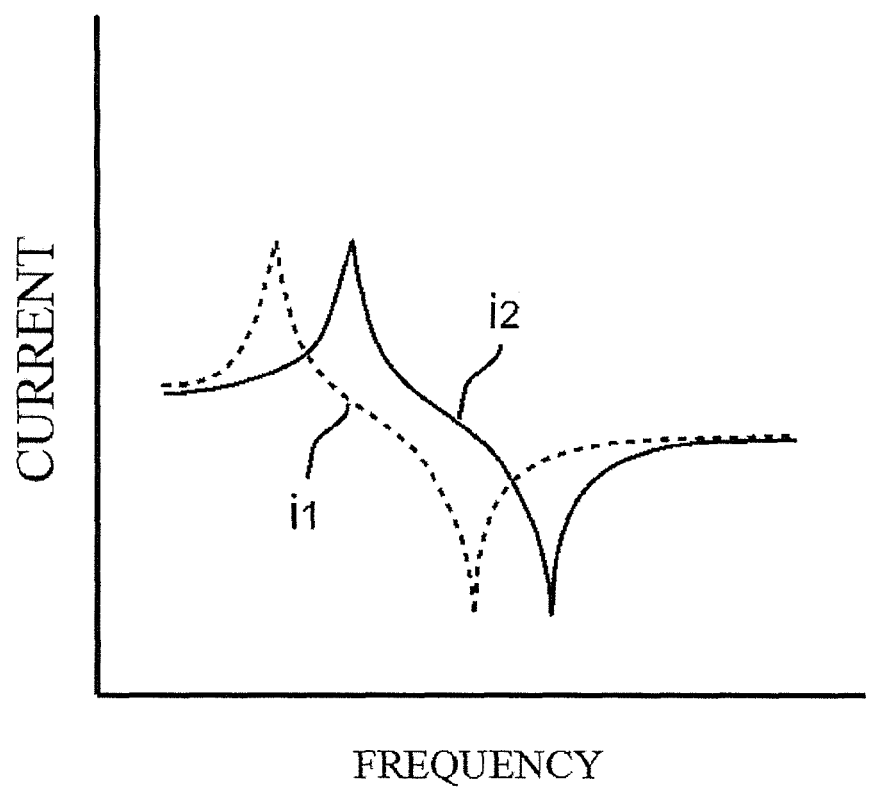
FIG. 6B illustrates one example of the respective frequency characteristics of a resonator current $i_1$ and a resonator current $i_2$.
Figure 6C:
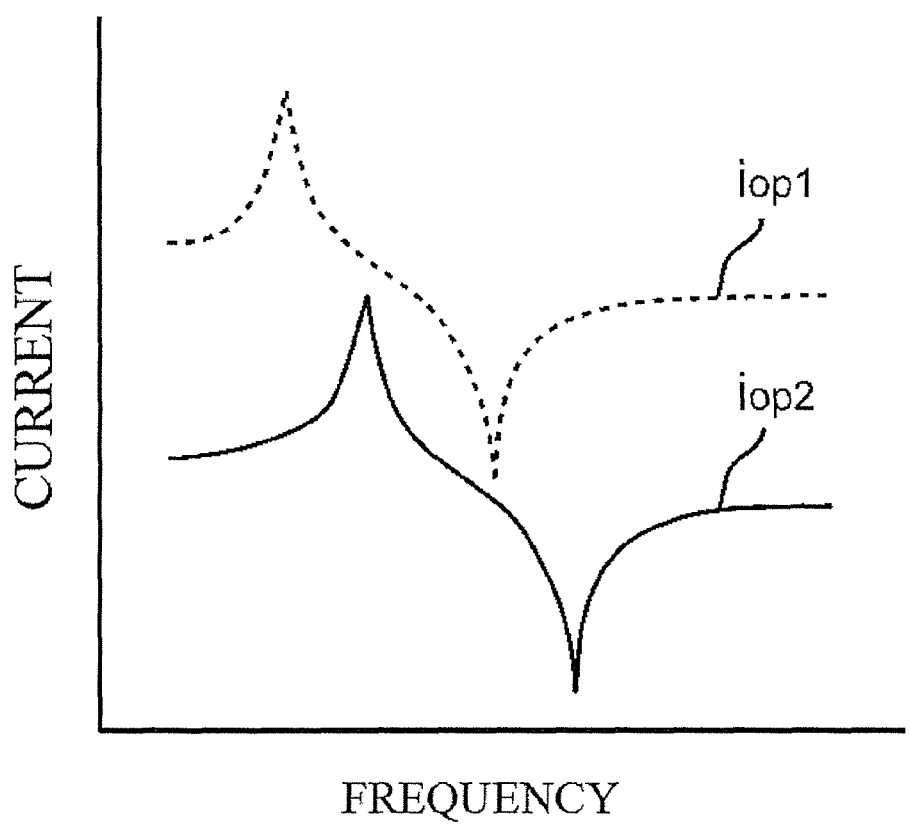
FIG. 6C illustrates one example of the respective frequency characteristics of a current $i_{op1}$ and a current $i_{op2}$.

FIG. 6B illustrates one example of the respective frequency characteristics of the resonator current $i_1$ and the resonator current $i_2$. FIG. 6C illustrates one example of the respective frequency characteristics of the current $i_{op1}$ and the current $i_{op2}$. FIG. 6C illustrates the case where the gain of the first adjusting unit 3 is larger than the gain of the second adjusting unit 4. It is found that synthesizing the current $i_{op1}$ and the current $i_{op2}$ illustrated in FIG. 6C causes the anti-resonance frequency between the anti-resonance frequency of the first resonator 1 and the anti-resonance frequency of the second resonator 2.

When the ratio between the gain of the first adjusting unit 3 and the gain of the second adjusting unit 4 is changed, the curved line illustrating the current $i_{op1}$ and the curved line illustrating the current $i_{op2}$ in FIG. 6C are shifted. Accordingly, the anti-resonance frequency changes. Specifically, changing the resistance value of the resistor 37 and the resistance value of the resistor 47 causes a change in ratio between the gain of the first adjusting unit 3 and the gain of the second adjusting unit 4. This allows changing the frequency at which the oscillator circuit 100 oscillates in the range from the anti-resonance frequency of the first resonator 1 to the anti-resonance frequency of the second resonator 2. Here, changing the respective resistance values of the resistor 38 and the resistor 48 also allows changing the frequency oscillated by the oscillator circuit 100 in the range from the anti-resonance frequency of the first resonator 1 to the anti-resonance frequency of the second resonator 2.

Figure 7A:
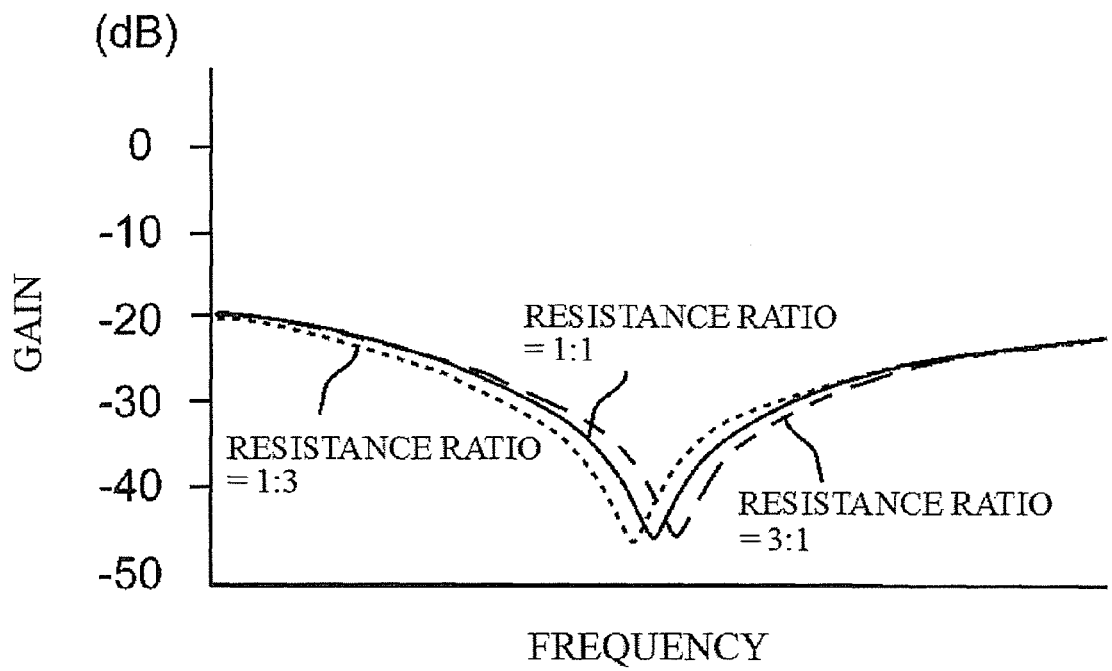
FIG. 7A illustrates frequency characteristics of the gain of the notch filter.
Figure 7B:
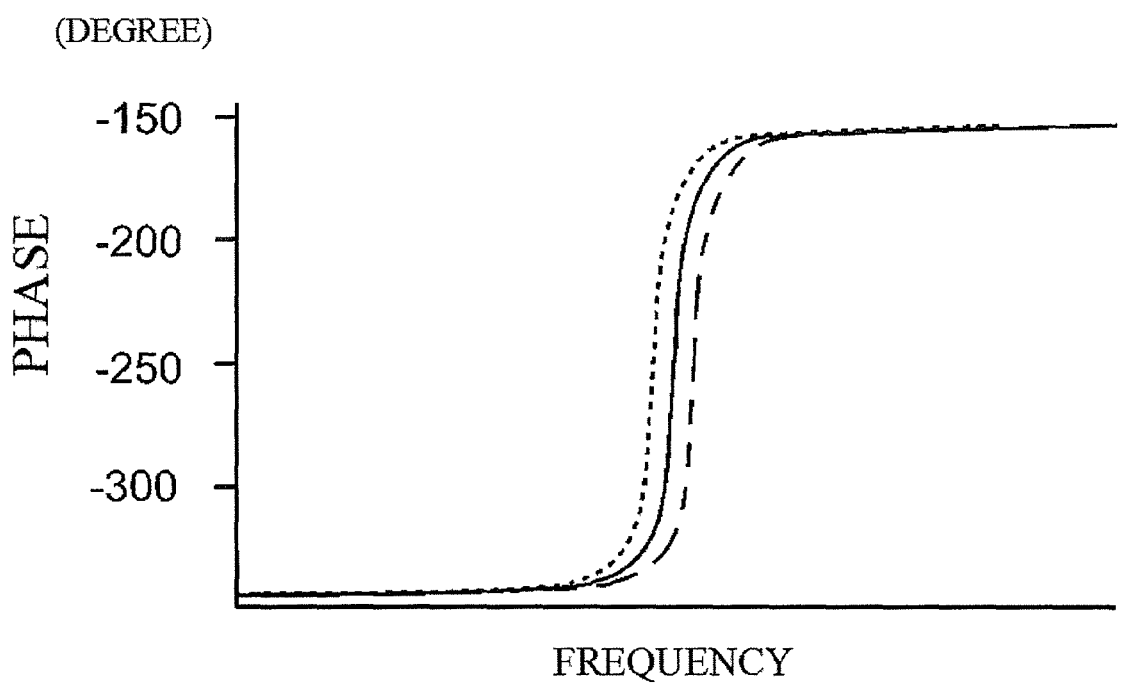
FIG. 7B illustrates frequency characteristics of the phase of the notch filter.

FIG. 7A illustrates the frequency characteristic of the gain of the notch filter 10 in the case where the resistance value of the resistor 37 and the resistance value of the resistor 47 in the circuit of FIG. 6A are changed. FIG. 7B illustrates the frequency characteristic of the phase of the notch filter 10 in the case where the resistance value of the resistor 37 and the resistance value of the resistor 47 in the circuit of FIG. 6A are changed.

In FIG. 7A and FIG. 7B, the dotted line illustrates the case where the ratio between the resistance value of the resistor 37 and the resistance value of the resistor 47 is 1:3. The solid line illustrates the case where the ratio between the resistance value of the resistor 37 and the resistance value of the resistor 47 is 1:1. The broken line illustrates the case where the ratio between the resistance value of the resistor 37 and the resistance value of the resistor 47 is 3:1. It is found that changing the ratio between the resistance value of the resistor 37 and the resistance value of the resistor 47 causes a change in ratio between the current flowing through the resistor 37 and the current flowing through the resistor 47, so as to change the frequency at which the oscillator circuit 100 oscillates.

Accordingly, in the case where the resistor 37 and the resistor 47 in FIG. 6A are variable resistors, the resistor 37 and the resistor 47 function as a ratio adjusting unit for adjusting the ratio between the collector current of the transistor 35 corresponding to the first current and the collector current of the transistor 45 corresponding to the second current. For example, in the case where the ratio between the resistance value of the resistor 37 and the resistance value of the resistor 47 is 1:3, the ratio between the value of the first current and the value of the second current becomes 3:1.

Here, in the case where the resistor 37 and the resistor 47 are digital potentiometers that each change the resistance value corresponding to a control signal from outside, the oscillation frequency of the oscillator circuit 100 can be changed in the range from the anti-resonance frequency of the first resonator 1 to the anti-resonance frequency of the second resonator 2 corresponding to the control signal from outside. Alternatively, the resistor 38 and the resistor 48 may be replaced by variable resistors so as to allow the resistor 38 and the resistor 48 to function as the ratio adjusting unit.

As described above, the oscillator circuit 100 according to the first embodiment includes the first resonator 1, the second resonator 2, the first adjusting unit 3, the second adjusting unit 4, the converting unit 5, and the amplifying unit 6. The second resonator 2 has the resonance frequency different from the resonance frequency of the first resonator 1. The amplifying unit 6 amplifies the voltage converted by the converting unit 5 and applies the amplified voltage to the first resonator 1 and the second resonator 2. This allows changing the oscillation frequency in the wide range from the anti-resonance frequency of the first resonator 1 to the anti-resonance frequency of the second resonator 2 without using the inductor having difficulty in incorporation into the integrated circuit. Here, as an application of the first embodiment, the oscillator circuit 100 may be constituted using the anti-resonance generated at a frequency between the respective resonance frequencies $fr_1$ and $fr_2$ of the first resonator 1 and the second resonator 2.

Second Embodiment

Figure 8:
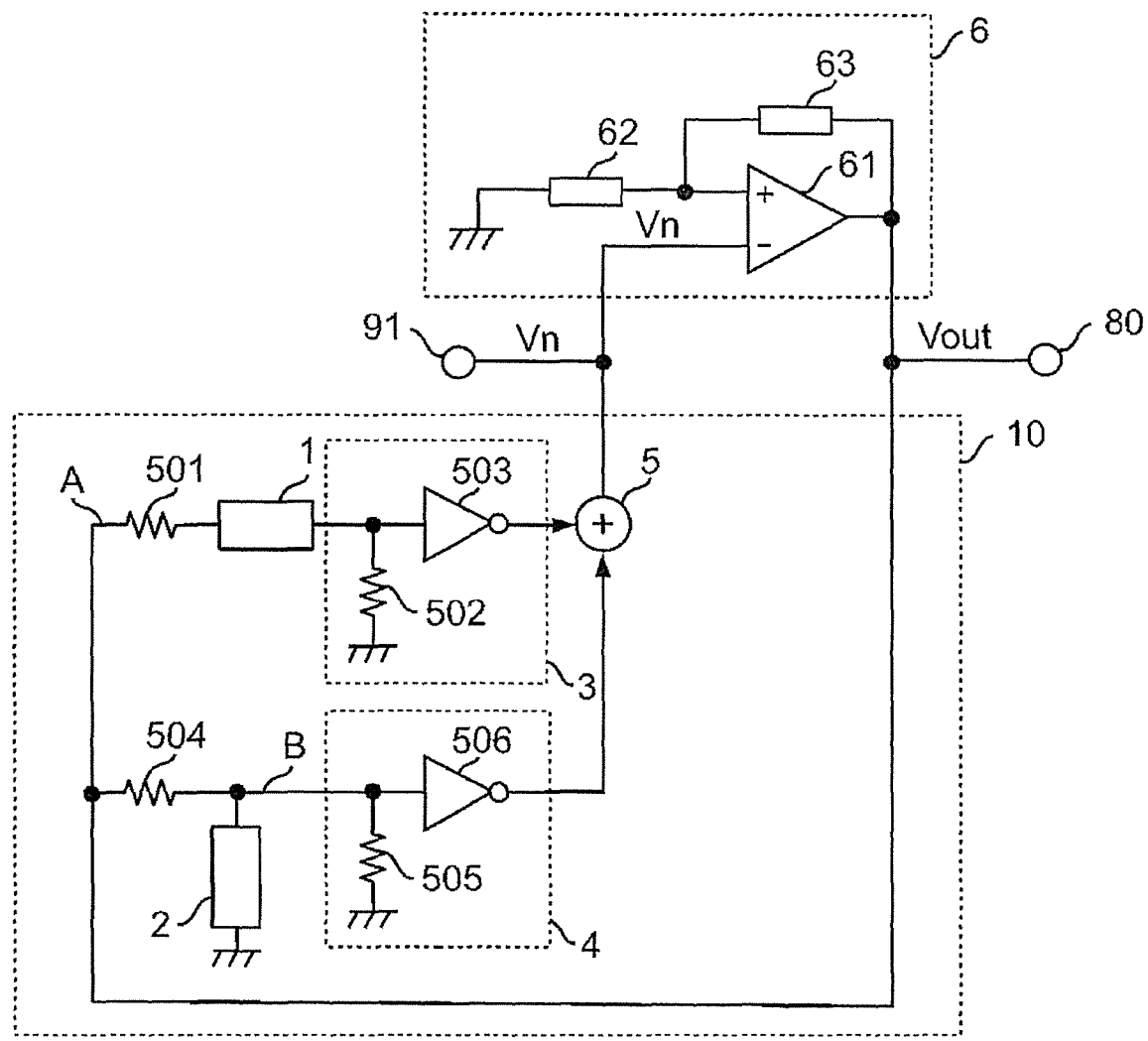
FIG. 8 illustrates a configuration example of an oscillator circuit according to a second embodiment.

FIG. 8 illustrates a configuration example of an oscillator circuit 200 according to a second embodiment. While the second resonator 2 is disposed in series with the second adjusting unit 4 in the path B of the oscillator circuit 100 illustrated in FIG. 1, the oscillator circuit 200 is different in that the second resonator 2 is disposed between the path B and the ground. That is, in the oscillator circuit 200, the first resonator 1 connects to the first adjusting unit 3 in series in the path A between the amplifying unit 6 and the first adjusting unit 3. The second resonator 2 connects to: the path B which connects the amplifying unit 6 and the second adjusting unit 4 together, and to the ground.

In the path A, a resistor 501 is disposed between the output side of the amplifying unit 6 and the first resonator 1. In the path B, a resistor 504 is disposed between the output side of the amplifying unit 6 and the second adjusting unit 4. The first adjusting unit 3 includes a resistor 502 and an inverting circuit 503. The second adjusting unit 4 includes a resistor 505 and an inverting circuit 506. The resistor 502 is disposed between: the connection point of the first resonator 1 and the inverting circuit 503, and the ground. The resistor 505 is disposed between: the connection point of the second resonator 2 and the inverting circuit 506, and the ground. The respective output signals from the inverting circuit 503 and the inverting circuit 506 are input to the converting unit 5.

Figure 9:
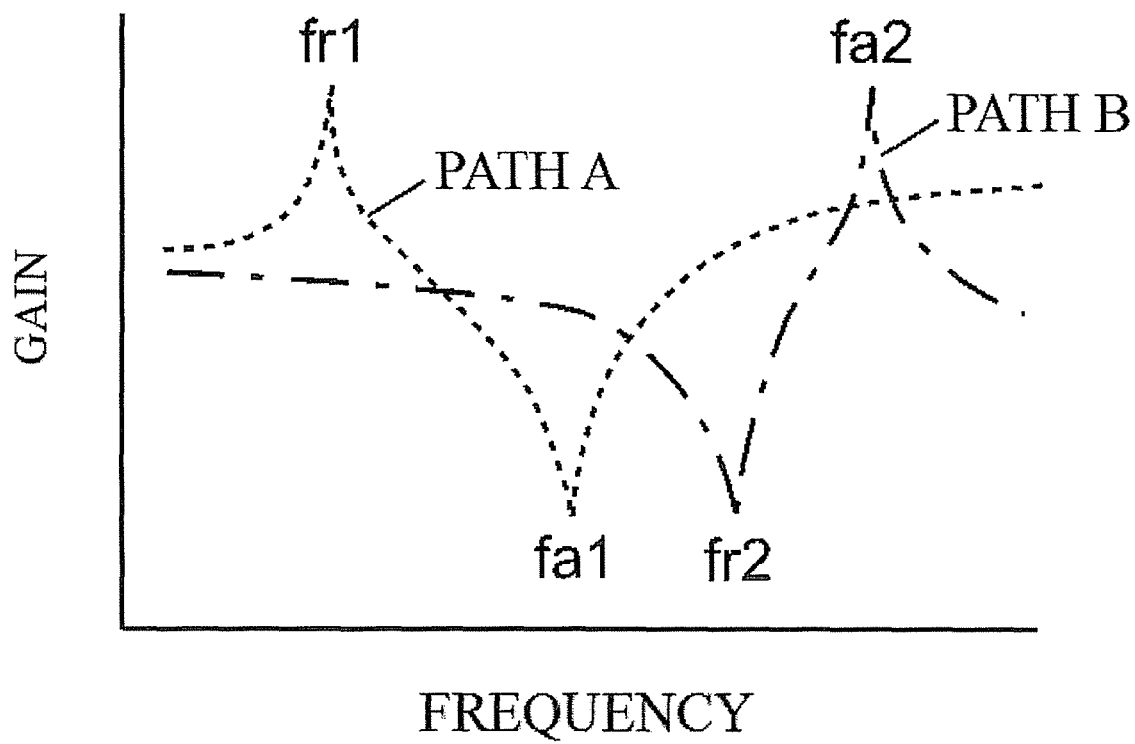
FIG. 9 illustrates respective frequency characteristics of the gains of a path A and a path B in a notch filter of the oscillator circuit according to the second embodiment.

FIG. 9 illustrates the frequency characteristics of the respective gains of the path A and the path B in the notch filter 10 of the oscillator circuit 200. In FIG. 9, the dotted line illustrates the frequency characteristic of the gain of the path A in which the first resonator 1 is disposed. The chain line illustrates the frequency characteristic of the gain of the path B in which the second resonator 2 is disposed. The gain of the path A becomes minimum at the anti-resonance frequency $fa_1$ of the first resonator 1. The gain of the path B becomes minimum at the resonance frequency $fr_2$ of the second resonator 2. Accordingly, the oscillator circuit 100 allows changing the frequency for oscillation in the range from the anti-resonance frequency $fa_1$ of the first resonator 1 to the resonance frequency $fr_2$ of the second resonator 2.

As described above, with the oscillator circuit 200 according to the second embodiment, the first resonator 1 connects to the first adjusting unit 3 in series in the path A between the amplifying unit 6 and the first adjusting unit 3. The second resonator 2 connects to: the path B which connects the amplifying unit 6 and the second adjusting unit 4 together, and to the ground. This allows changing the oscillation frequency in the range from the anti-resonance frequency of the first resonator 1 to the resonance frequency of the second resonator 2.

Third Embodiment

Figure 10:
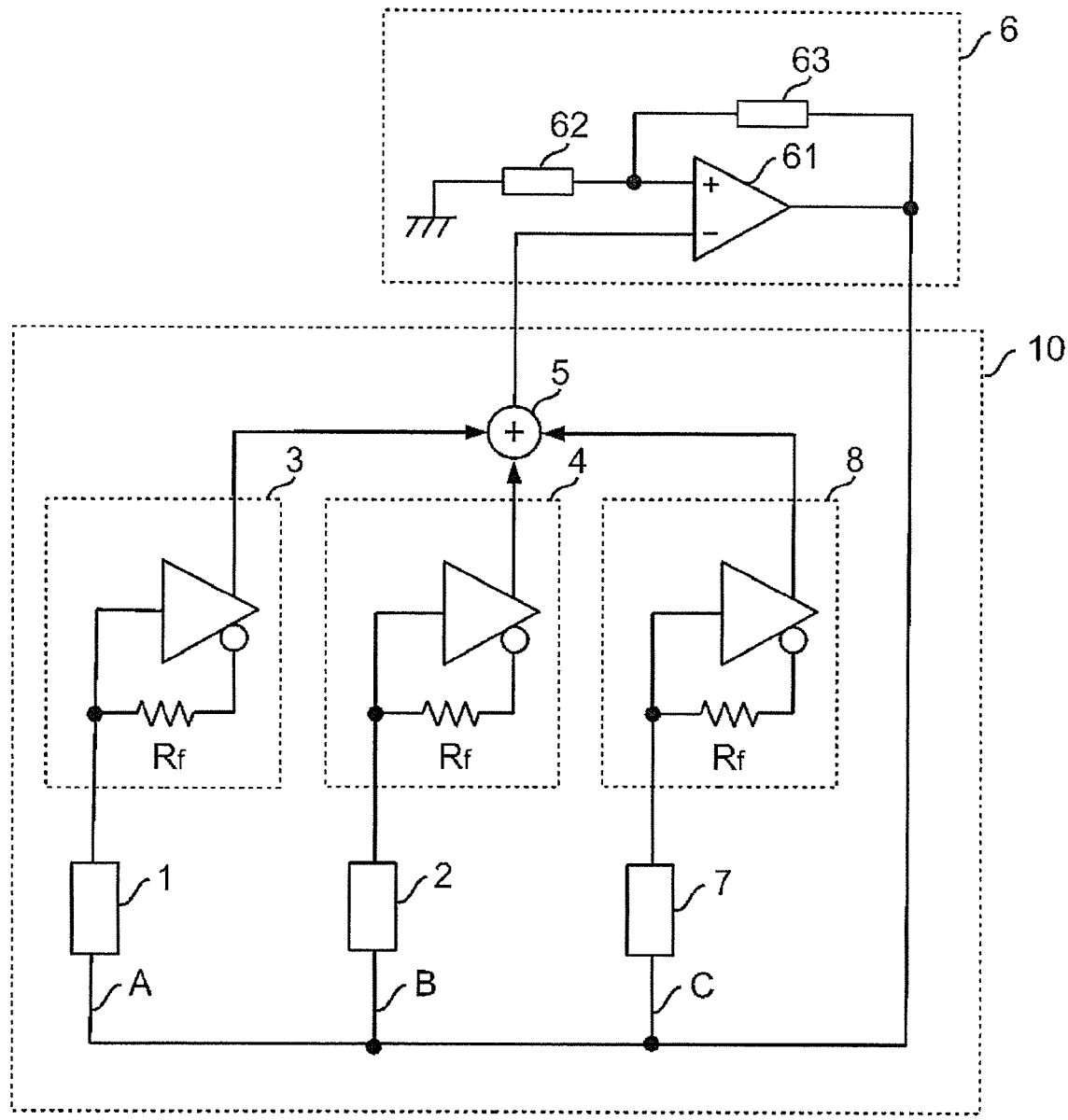
FIG. 10 illustrates a configuration example of an oscillator circuit according to a third embodiment.

FIG. 10 illustrates a configuration example of an oscillator circuit 300 according to a third embodiment. The oscillator circuit 300 is different from the oscillator circuit 100 illustrated in FIG. 1 in that the notch filter 10 additionally includes a third resonator 7 and a third converting unit 8 connected to a path C.

The third converting unit 8 converts the signal output from the third resonator 7 into a third signal with a third current value. For example, in the case where there is a relationship of the anti-resonance frequency of the first resonator 1<the anti-resonance frequency of the second resonator 2<the anti-resonance frequency of the third resonator 7, adjusting the respective values of the resistors for changing the respective output currents of the first adjusting unit 3, the second adjusting unit 4, and the third converting unit 8 allows causing the oscillator circuit 300 to oscillate at the frequency from the anti-resonance frequency of the first resonator 1 to the anti-resonance frequency of the third resonator 7.

The oscillator circuit 300 may include more than three resonators. Increasing the number of the resonators allows changing the frequency by small steps over the wider frequency range. Additionally, the frequency change range for each resonator can be small. This also achieves the effect for reducing the influence of noise. Here, while in FIG. 10 the third resonator 7 connects to the third converting unit 8 in series in the path C, the third resonator 7 may connect to the path C and the ground.

Thus, the plurality of resonators may each connect to a converting unit in series in the path to which the respective resonator connects, or may each connect to the path and the ground. In the case where the notch filter 10 includes a series resonator connected to the converting unit in series in the path and a parallel resonator connected to the path and the ground, the condition for oscillation of the oscillator circuit in which the notch filter 10 is disposed is as follows. The resonance frequency of the series resonator and the anti-resonance frequency of the parallel resonator are not included between: the minimum frequency of the anti-resonance frequency of the series resonator and the resonance frequency of the parallel resonator, and the maximum frequency of the anti-resonance frequency of the series resonator and the resonance frequency of the parallel resonator.

As described above, the oscillator circuit 300 according to the third embodiment includes more than three resonators and a converting unit. The oscillator circuit 300 allows further expanding the frequency range that can be changed and is less likely to be affected by noise.

This disclosure is described with the embodiments. The technical scope of this disclosure is not limited to the above-described embodiments. Various modifications and improvements of the embodiments will become apparent to those skilled in the art. It is apparent that embodiments thus modified and improved are also within the technical scope of this disclosure according to the description of the claims.

For example, the configuration of the amplifying unit 6 is not limited to the configuration in the above-described embodiment, and can employ another configuration in which the voltage output from the notch filter 10 can be amplified so as to be applied to the notch filter 10. For example, while in the above-described embodiment the converting unit 5 and the amplifying unit 6 have been described as different circuit blocks, the converting unit 5 may have the amplification function of the amplifying unit 6.

While in the above-described embodiment the configuration in which the converting unit 5 converts the first current and the second current into a voltage has been described, the embodiment is not limited to this configuration. For example, the following configuration is possible. The first adjusting unit 3 converts the first current into a voltage. The second adjusting unit 4 converts the second current into a voltage. The converting unit 5 synthesizes the plurality of voltages that are converted from the first current and the second current in the first adjusting unit 3 and the second adjusting unit 4.

Additionally, in the oscillator circuit 100, the first resonator may connect to the path A and the ground, and the second resonator may connect to the path B and the ground.

While in the above-described embodiment the examples using bipolar transistors have been described, field effect transistors may be used instead of the bipolar transistors. In this case, the collector of the bipolar transistor is substituted for the drain of the field effect transistor. The emitter of the bipolar transistor is substituted for the source of the field effect transistor. The base of the bipolar transistor is substituted for the gate of the field effect transistor.

This disclosure provides an oscillator circuit that includes a first resonator, a second resonator, a first adjusting unit, a second adjusting unit, a converting unit, and an amplifying unit. The second resonator has a resonance frequency different from a resonance frequency of the first resonator. The first adjusting unit is configured to adjust a first current value of a first current. The first current flows through a first path. The first path connects to the first resonator. The second adjusting unit is configured to adjust a second current value of a second current. The second current flows through a second path. The second path connects to the second resonator. The converting unit is configured to convert the first current and the second current into a voltage corresponding to the first current value and the second current value. The amplifying unit is configured to amplify a voltage converted by the converting unit and apply the amplified voltage to the first resonator and the second resonator.

The above-described oscillator circuit may further include a ratio adjusting unit. The ratio adjusting unit is configured to adjust a ratio between the first current value and the second current value. The above-described first adjusting unit includes a first transistor and a first variable resistor. The first transistor causes a flow of the first current. The first variable resistor is configured to adjust the first current value. The above-described second adjusting unit may include a second transistor and a second variable resistor. The second transistor causes a flow of the second current. The second variable resistor is configured to adjust the second current value.

For example, the above-described first resonator connects in series to the first adjusting unit in the first path between the amplifying unit and the first adjusting unit. The second resonator connects in series to the second adjusting unit in the second path between the amplifying unit and the second adjusting unit. An anti-resonance frequency of the first resonator and an anti-resonance frequency of the second resonator are higher than a resonance frequency of the first resonator and a resonance frequency of the second resonator.

The above-described first resonator connects in series to the first adjusting unit in the first path between the amplifying unit and the first adjusting unit. The second resonator connects to the second path and the ground. The second path is disposed between the amplifying unit and the second adjusting unit. An anti-resonance frequency of the first resonator and a resonance frequency of the second resonator may be frequencies between a resonance frequency of the first resonator and an anti-resonance frequency of the second resonator.

The oscillator circuit according to this disclosure can be incorporated into an integrated circuit, and provides an effect that allows changing the oscillation frequency in a wide frequency range.

Figure 11:
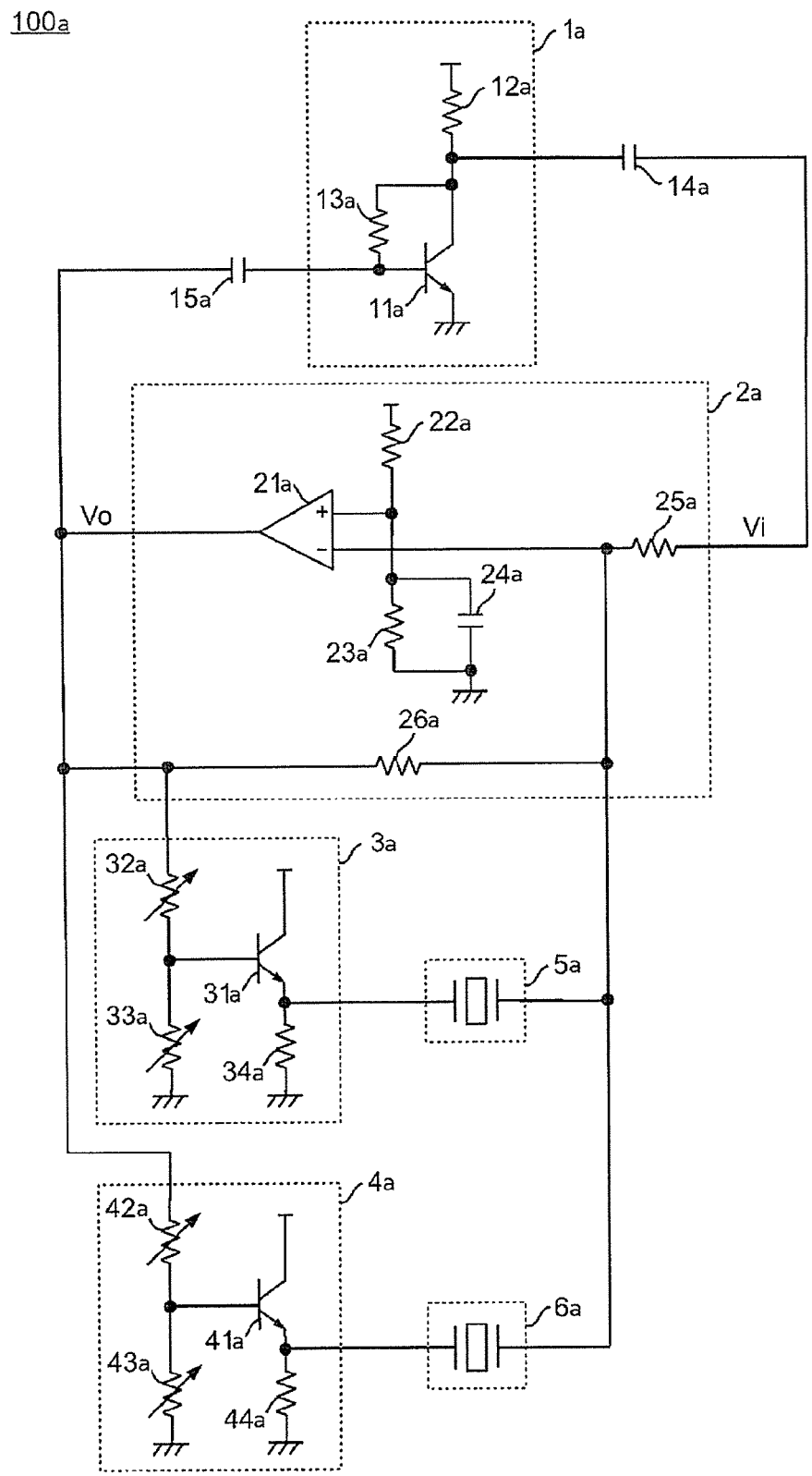
FIG. 11 illustrates a configuration example of an oscillator circuit of a fourth embodiment.

Circuit Configuration of Oscillator Circuit 100*a* According to Fourth Embodiment FIG. 11 illustrates a configuration example of an oscillator circuit 100*a* of a fourth embodiment. The oscillator circuit 100*a* includes a first amplifier 1*a*, an inverting amplifier 2*a* including a second amplifier 21*a*, a third amplifier 3*a*, a fourth amplifier 4*a*, a first resonator 5*a*, and a second resonator 6*a*.

The first amplifier 1*a* amplifies a signal to be input so as to generate an oscillation signal. The inverting amplifier 2*a* connects to the output side of the first amplifier 1*a* via a capacitor 14*a* at the input side of the inverting amplifier 2*a*, and connects to the input side of the first amplifier 1*a* via a capacitor 15*a* at the output side of the inverting amplifier 2*a*. The third amplifier 3*a* and the first resonator 5*a* connect to each other in series while connecting to the second amplifier 21*a* and the resistor 26*a* in parallel. The fourth amplifier 4*a* and the second resonator 6*a* connect to each other in series while connecting to the second amplifier 21*a* and the resistor 26*a* in parallel. At least one of the third amplifier 3*a* and the fourth amplifier 4*a* has a variable gain, and can change the gain, for example, corresponding to a control signal input from outside of the oscillator circuit 100*a*. The first resonator 5*a* and the second resonator 6*a* have mutually different anti-resonance frequencies. The following describes the detail of the circuit of the oscillator circuit 100*a*.

The first amplifier 1*a* includes a transistor 11*a*, a resistor 12*a*, and a resistor 13*a*. The transistor 11*a* is an NPN-type transistor. The emitter of the transistor 11*a* connects to the ground. The collector of the transistor 11*a* connects to a power source via the resistor 12*a*. The collector of the transistor 11*a* connects to the input side of the inverting amplifier 2*a* via the capacitor 14*a*. The base of the transistor 11*a* connects to the output side of the inverting amplifier 2*a* via the capacitor 15*a*. The resistor 13*a* is disposed between the base and the collector of the transistor 11*a*.

The inverting amplifier 2*a* includes the second amplifier 21*a*, a resistor 22*a*, a resistor 23*a*, a capacitor 24*a*, a resistor 25*a*, and a resistor 26*a*. The second amplifier 21*a* inversely amplifies the output signal of the first amplifier 1*a* and inputs the inversely amplified signal to the first amplifier 1*a*. Specifically, the second amplifier 21*a* is, for example, an operational amplifier that has a non-inverting input terminal. The non-inverting input terminal connects to respective one ends of the resistor 22*a*, the resistor 23*a*, and the capacitor 24*a*. The other end of the resistor 22*a* connects to the power source. The respective other ends of the resistor 23*a* and the capacitor 24*a* connect to the ground. The non-inverting input terminal of the second amplifier 21*a* receives a voltage obtained by dividing the power source voltage corresponding to the resistance ratio between the resistor 22*a* and the resistor 23*a*. The inverting input terminal of the second amplifier 21a connects to the resistor 25a, the resistor 26a, the first resonator 5a, and the second resonator 6a.

The resistor 26a is connected between the input and the output of the second amplifier 21a. That is, one end of the resistor 26a connects to the inverting input terminal of the second amplifier 21a and the resistor 25a. The other end of the resistor 26a connects to the output terminal of the second amplifier 21a.

The third amplifier 3a includes a transistor 31a, a variable resistor 32a, a variable resistor 33a, and a resistor 34a. The collector of the transistor 31a connects to the power source. The base of the transistor 31a connects to the variable resistor 32a and the variable resistor 33a. The emitter of the transistor 31a connects to the ground via the resistor 34a, and connects to one end of the first resonator 5a.

The transistor 31a, the variable resistor 32a, the variable resistor 33a, and the resistor 34a constitute a common collector circuit. That is, the transistor 31a functions as an emitter follower that outputs a voltage changing corresponding to the resistance ratio between the variable resistor 32a and the variable resistor 33a from the emitter. The variable resistor 32a and the variable resistor 33a are, for example, digital potentiometers that can each be adjusted to the resistance value corresponding to a control signal from outside.

The fourth amplifier 4a includes a transistor 41a, a variable resistor 42a, a variable resistor 43a, and a resistor 44a. The collector of the transistor 41a connects to the power source. The base of the transistor 41a connects to the variable resistor 42a and the variable resistor 43a. The emitter of the transistor 41a connects to the ground via the resistor 44a, and connects to one end of the second resonator 6a.

The transistor 41a, the variable resistor 42a, the variable resistor 43a, and the resistor 44a constitute a common collector circuit. That is, the transistor 41a functions as an emitter follower that outputs a voltage changing corresponding to the resistance ratio between the variable resistor 42a and the variable resistor 43a from the emitter. The variable resistor 42a and the variable resistor 43a are, for example, digital potentiometers that can each be adjusted to the resistance value corresponding to a control signal from outside.

While in FIG. 11 the variable resistor 32a, the variable resistor 33a, the variable resistor 42a, and the variable resistor 43a are illustrated as variable resistors, it is only necessary to employ at least one of these variable resistors as a variable resistor. The method for changing the gains of the third amplifier 3a and the fourth amplifier 4a may employ a method other than the method for changing the respective resistance values of the variable resistor 32a, the variable resistor 33a, the variable resistor 42a, and the variable resistor 43a.

The first resonator 5a and the second resonator 6a each employ, for example, an AT-cut crystal resonator, an SC-cut crystal resonator, or an MEMS resonator. The first resonator 5a and the second resonator 6a have mutually different resonance frequencies (series resonance frequencies) and anti-resonance frequencies (parallel resonance frequencies). The first resonator 5a has the resonance frequency of $fr_1$ and the anti-resonance frequency of $fa_1$. The second resonator 6a has the resonance frequency of $fr_2$ and the anti-resonance frequency of $fa_2$.

In this embodiment, the resonance frequency of the second resonator 6a is larger than the resonance frequency of the first resonator 5a. The anti-resonance frequency of the first resonator 5a is larger than the resonance frequency of the second resonator 6a. The anti-resonance frequency of the second resonator 6a is larger than the anti-resonance frequency of the first resonator 5a. That is, the relationship between the respective resonance frequencies and anti-resonance frequencies of the first resonator 5a and the second resonator 6a is $fr_1 < fr_2 < fa_1 < fa_2$.

Figure 12:
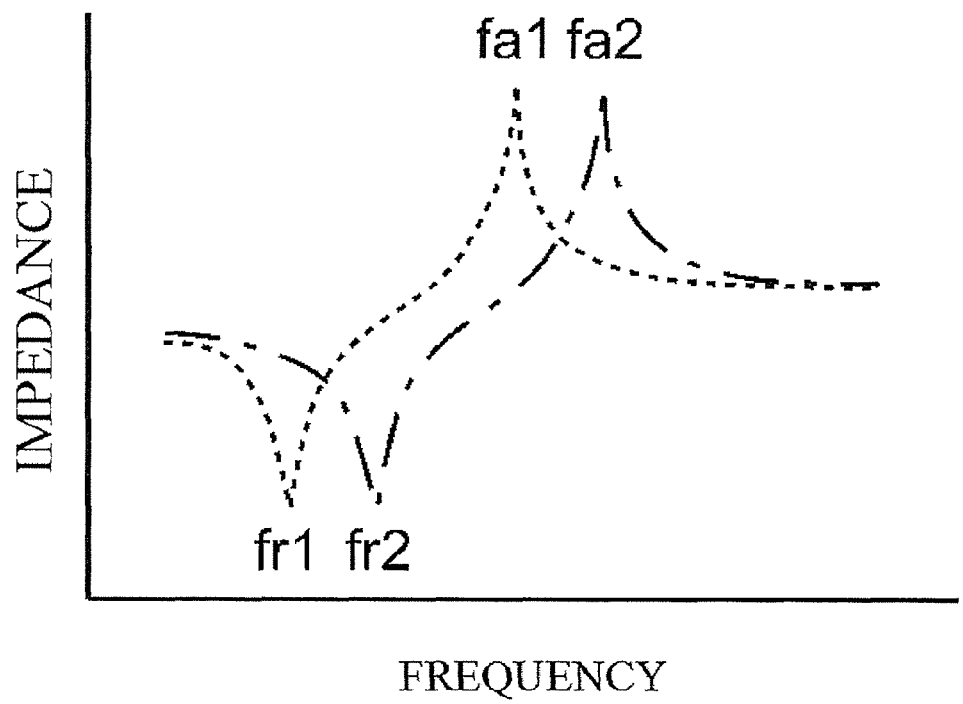
FIG. 12 illustrates respective frequency characteristics of the impedances of a first resonator and a second resonator.

FIG. 12 illustrates the respective frequency characteristics of the impedances of the first resonator 5a and the second resonator 6a. The dotted line illustrates the impedance of the first resonator 5a. The chain line illustrates the impedance of the second resonator 6a. The impedance of the first resonator 5a becomes minimum at the resonance frequency $fr_1$, and becomes maximum at the anti-resonance frequency $fa_1$. The impedance of the second resonator 6a becomes minimum at the resonance frequency $fr_2$, and becomes maximum at the anti-resonance frequency $fa_2$.

Gain Characteristic of Oscillator Circuit 100a

Assuming that the oscillator circuit 100a is made to be an open-loop circuit at the input port of the inverting amplifier 2a, the voltage input to the inverting amplifier 2a is Vi, and the voltage output from the inverting amplifier 2a is Vo, the rough estimation of the transfer characteristic from the input Vi to the output Vo is expressed by the following formula.

$$\frac{Vo}{Vi} \approx -\frac{1}{R_1\left(\frac{1}{R_2} + \frac{G_1}{Z_1} + \frac{G_2}{Z_2}\right)} \quad \text{Formula (3)}$$

Here, $G_1$ denotes the gain from the input to the output of the third amplifier 3a. $G_2$ denotes the gain from the input to the output of the fourth amplifier 4a. $Z_1$ denotes the impedance of the first resonator 5a. $Z_2$ denotes the impedance of the second resonator 6a. $R_1$ denotes the resistance value of the resistor 25a. $R_2$ denotes the resistance value of the resistor 26a.

In the case where the gain $G_1$ of the third amplifier 3a is sufficiently larger than the gain $G_2$ of the fourth amplifier 4a, the transfer characteristic is determined mainly by the ratio between $R_1$ and $Z_1$. The denominator in the above-described formula of the transfer characteristic becomes minimum at the anti-resonance frequency of the first resonator 5a as a frequency at which the impedance $Z_1$ of the first resonator 5a becomes maximum. Accordingly, the peak at which the gain of the transfer characteristic becomes larger than 1 appears at the anti-resonance frequency of the first resonator 5a. Thus, the oscillation condition of the oscillator circuit 100a is satisfied.

Similarly, in the case where the gain $G_2$ of the fourth amplifier 4a is sufficiently larger than the gain $G_1$ of the third amplifier 3a, the transfer characteristic is determined mainly by the ratio between $R_2$ and $Z_2$. The denominator in the above-described formula of the transfer characteristic becomes minimum at the anti-resonance frequency of the second resonator 6a as a frequency at which the impedance $Z_2$ of the second resonator 6a becomes maximum. Accordingly, the peak at which the gain of the transfer characteristic becomes larger than 1 appears at the anti-resonance frequency of the second resonator 6a. Thus, the oscillation condition of the oscillator circuit 100a is satisfied.

As is apparent from the above description, in the oscillator circuit 100a, adjusting the ratio between the gain $G_1$ of the third amplifier 3a and the gain $G_2$ of the fourth amplifier 4a allows changing the frequency with the peak at which the gain of the transfer characteristic becomes larger than 1. Specifically, in the third amplifier 3a illustrated in FIG. 11, adjusting at least one of the variable resistor 32a and the variable resistor 33a allows changing the gain $G_1$ of the third amplifier 3a. Additionally, in the fourth amplifier 4a illustrated in FIG. 11, adjusting at least one of the variable resistor 42a and the variable resistor 43a allows changing the gain $G_2$ of the fourth amplifier 4a. Here, the respective gains of the third amplifier 3a and the fourth amplifier 4a may be changed by another method.

Figure 13:
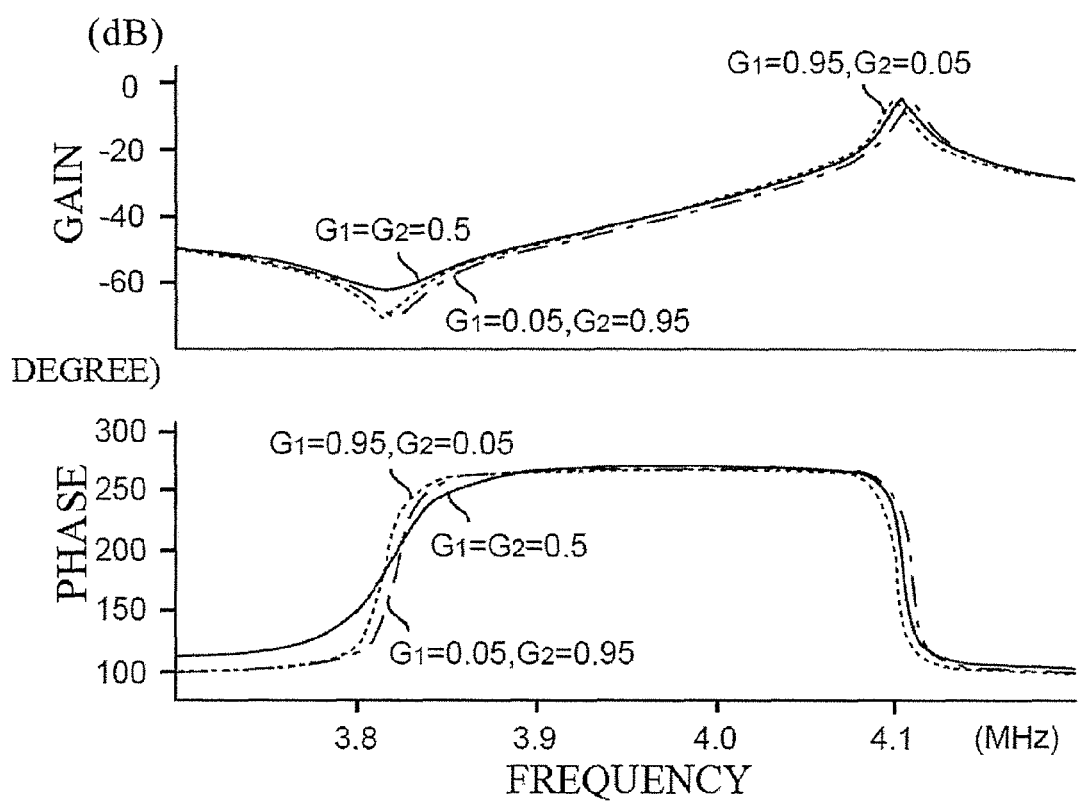
FIG. 13 illustrates a simulation result of a transfer characteristic from Vi to Vo of the oscillator circuit illustrated in FIG. 11.

FIG. 13 illustrates a simulation result of the transfer characteristic from Vi to Vo of the oscillator circuit 100a illustrated in FIG. 11. In the example illustrated in FIG. 13, assume that the first resonator 5a has the resonance frequency of 3.816 MHz and the anti-resonance frequency of 4.104 MHz and the second resonator 6a has the resonance frequency of 3.823 MHz and the anti-resonance frequency of 4.115 MHz. The solid line illustrates the characteristic in the case where adjustment is performed to obtain $G_1=G_2=0.5$ times. The dotted line illustrates the characteristic in the case where adjustment is performed to obtain $G_1=0.95$ times and $G_2=0.05$ times. The chain line illustrates the characteristic in the case where adjustment is performed to obtain $G_1=0.05$ times and $G_2=0.95$ times. The finding is as follows. In the gain characteristic, different peak frequencies are obtained in the vicinity of 4.1 MHz. The phase is changed by 180 degrees in conjunction with the peak frequencies.

Here, the first amplifier 1a changes the phase of the input signal by 180 degrees and outputs the changed phase. The inverting amplifier 2a changes the phase of the output signal of the first amplifier 1a by 180 degrees and inputs this changed output signal to the first amplifier 1a. Accordingly, designing the sum of the gain of the first amplifier 1a and the peak gain of the inverting amplifier 2a to be 0 dB or more can satisfy the oscillation condition of both the gain and the phase.

As described above, the oscillator circuit 100a according to the fourth embodiment includes the first amplifier 1a, the second amplifier 21a, the resistor 26a, the first resonator 5a, the third amplifier 3a, the second resonator 6a, and the fourth amplifier 4a. The first resonator 5a and the third amplifier 3a connect to each other in series while connecting to the resistor 26a in parallel. The second resonator 6a and the fourth amplifier 4a connect to each other in series while connecting to the resistor 26a in parallel. The first resonator 5a has the anti-resonance frequency different from the anti-resonance frequency of the second resonator 6a. At least one of the third amplifier 3a and the fourth amplifier 4a has a variable gain. The oscillator circuit 100a allows changing the oscillation frequency between the anti-resonance frequency of the first resonator 5a and the anti-resonance frequency of the second resonator 6a.

Fifth Embodiment with Floating Negative Capacitance Circuit

Figure 14:
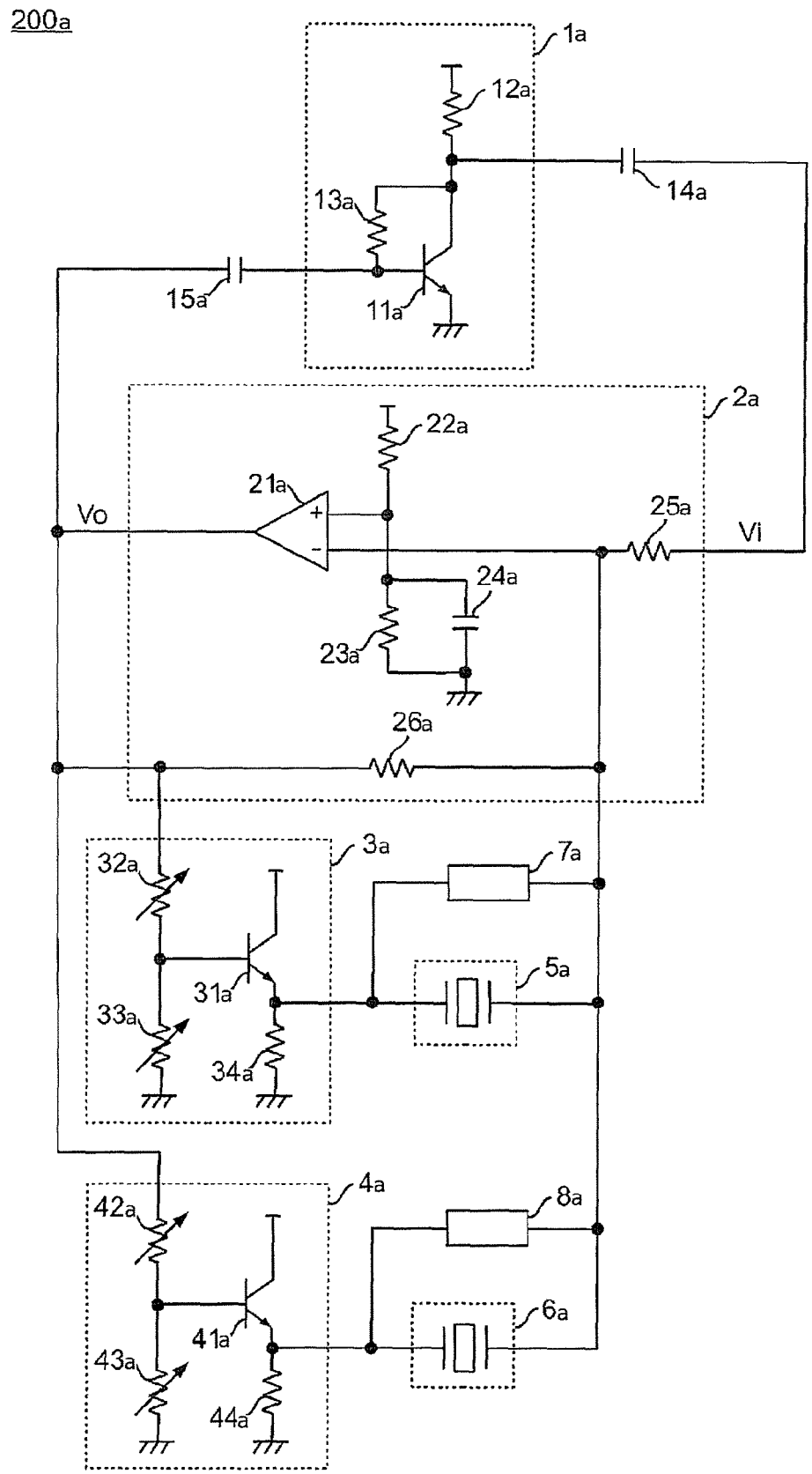
FIG. 14 illustrates a configuration example of an oscillator circuit according to a fifth embodiment.

FIG. 14 illustrates a configuration example of an oscillator circuit 200a according to a fifth embodiment. The oscillator circuit 200a is different from the oscillator circuit 100a illustrated in FIG. 11 in that the oscillator circuit 200a further includes a first negative capacitance circuit 7a and a second negative capacitance circuit 8a, and is otherwise similar to the oscillator circuit 100a. The first negative capacitance circuit 7a is disposed in parallel to the first resonator 5a. The first negative capacitance circuit 7a has a capacitance with the opposite polarity to the polarity of the equivalent parallel capacitance of the first resonator 5a and with a value approximately equal to the value of the equivalent parallel capacitance of the first resonator 5a. The second negative capacitance circuit 8a is disposed in parallel to the second resonator 6a. The second negative capacitance circuit 8a has a capacitance with the opposite polarity to the polarity of the equivalent parallel capacitance of the second resonator 6a and with a value approximately equal to the value of the equivalent parallel capacitance.

Here, it is only necessary that the oscillator circuit 200a includes a negative capacitance circuit in the resonator with the lower anti-resonance frequency. For example, in the case where the anti-resonance frequency of the first resonator 5a is lower than the anti-resonance frequency of the second resonator 6a, it is only necessary that the oscillator circuit 200a includes at least the first negative capacitance circuit 7a.

Figure 15:
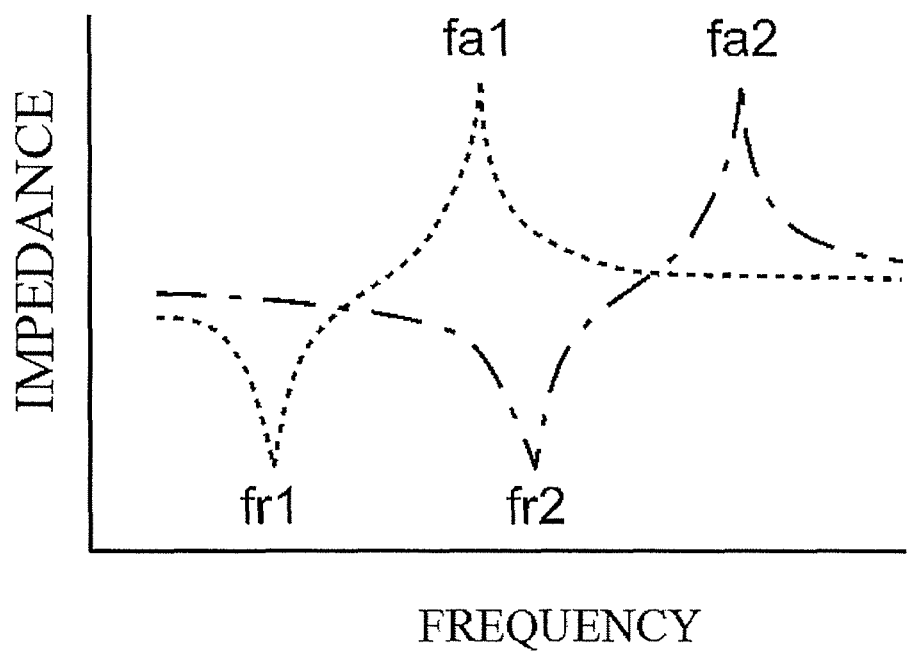
FIG. 15 illustrates respective frequency characteristics of impedances of a first resonator and a second resonator in the fifth embodiment.

FIG. 15 illustrates the respective frequency characteristics of the impedances of the first resonator 5a and the second resonator 6a in the second embodiment. The relationship between the respective resonance frequencies and anti-resonance frequencies of the first resonator 5a and the second resonator 6a illustrated in FIG. 15 is $fr_1<fa_1<fr_2<fa_2$. That is, the resonance frequency and the anti-resonance frequency of the first resonator 5a are smaller than the resonance frequency and the anti-resonance frequency of the second resonator 6a. In this case, the resonance frequency $fr_2$ of the second resonator 6a exists between the anti-resonance frequency $fa_1$ of the first resonator 5a and the anti-resonance frequency $fa_2$ of the second resonator 6a. Accordingly, in the configuration of the oscillator circuit 100a in which the frequency is assumed to be changed between the anti-resonance frequency $fa_1$ of the first resonator 5a and the anti-resonance frequency $fa_2$ of the second resonator 6a, the oscillation condition is not satisfied in the entire frequency range between the anti-resonance frequency $fa_1$ of the first resonator and the anti-resonance frequency $fa_2$ of the second resonator 6a. Thus, the oscillation condition is satisfied only in a narrow frequency range.

In contrast, in the oscillator circuit 200a, the first negative capacitance circuit 7a and the second negative capacitance circuit 8a cancel the respective equivalent parallel capacitances of the first resonator 5a and the second resonator 6a. This reduces the influence of the anti-resonance frequency. Accordingly, the oscillator circuit 200a oscillates at the frequency from the resonance frequency of the first resonator 5a to the resonance frequency of the second resonator 6a.

Figure 16A:
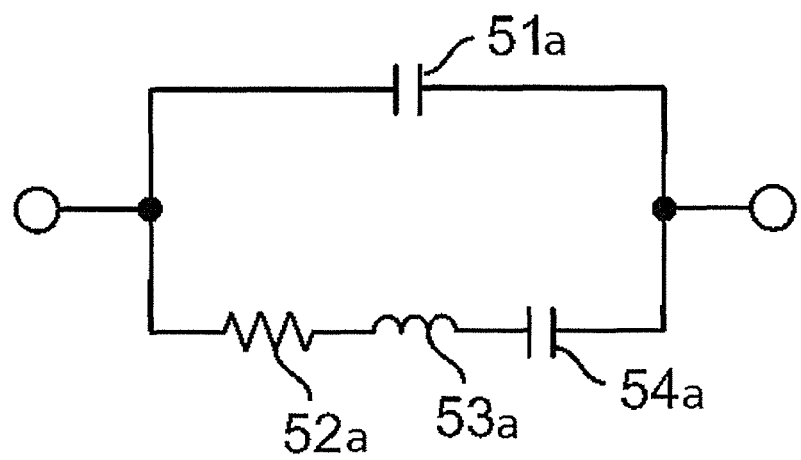
FIG. 16A illustrates an equivalent circuit of the first resonator.
Figure 16B:
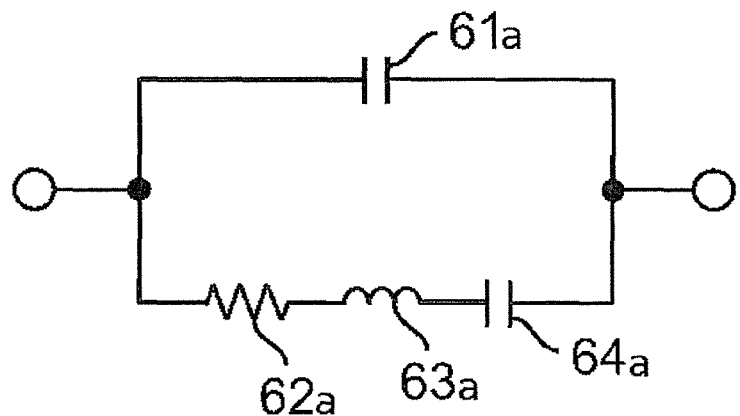
FIG. 16B illustrates an equivalent circuit of the second resonator.

FIG. 16A illustrates the equivalent circuit of the first resonator 5a. In the first resonator 5a, an equivalent parallel capacitor 51a connects in parallel to an equivalent series resistor 52a, an equivalent series inductor 53a, and an equivalent series capacitor 54a that are connected to one another in series. FIG. 16B illustrates the equivalent circuit of the second resonator 6a. In the second resonator 6a, the equivalent parallel capacitor 61a connects in parallel to an equivalent series resistor 62a, the equivalent series inductor 63a, and an equivalent series capacitor 64a that are connected to one another in series.

The first negative capacitance circuit 7a is disposed in parallel to the first resonator 5a, and has a capacitance with the opposite polarity and approximately the same value with respect to the capacitance of the equivalent parallel capacitor 51a. This allows cancelling the equivalent parallel capacitor 51a. Similarly, the second negative capacitance circuit 8a is disposed in parallel to the second resonator 6a, and has a capacitance with the opposite polarity and approximately the same value with respect to the capacitance of the equivalent parallel capacitor 61a. This allows cancelling the equivalent parallel capacitor 61a of the second resonator 6a.

Figure 17:
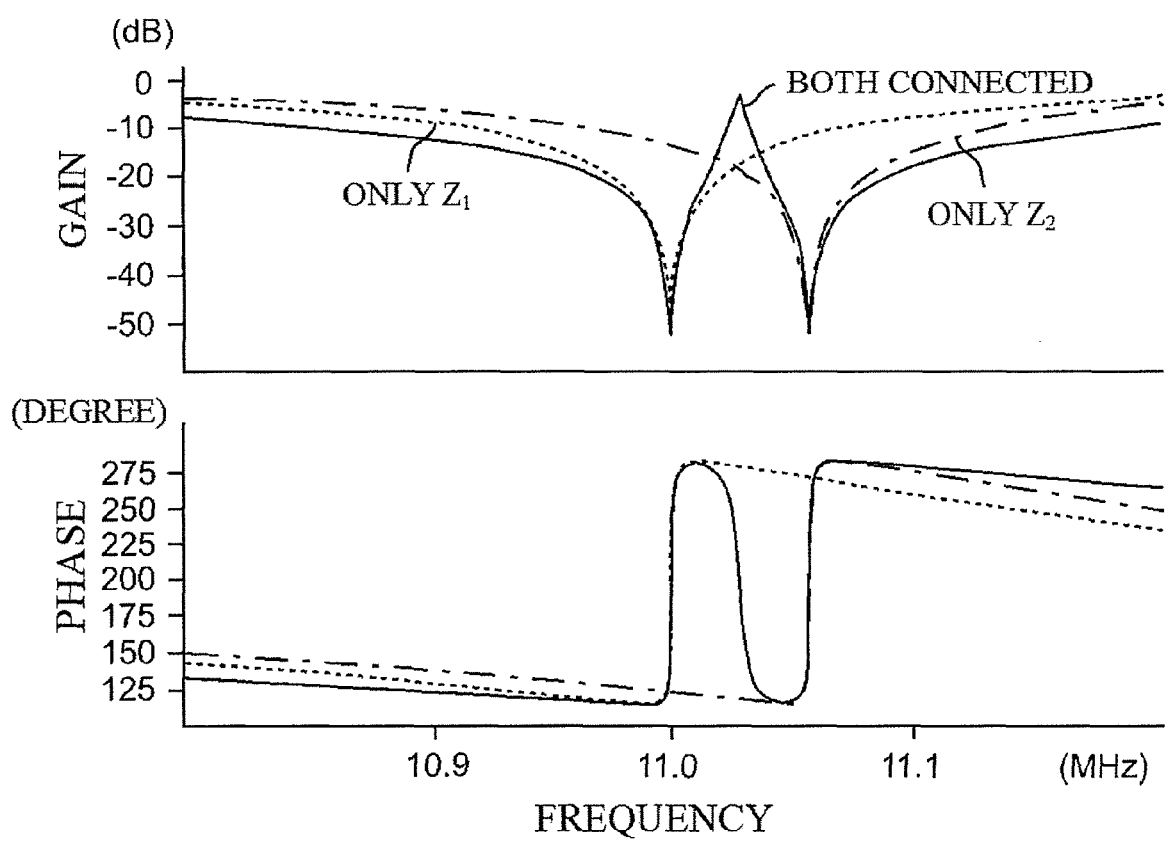
FIG. 17 illustrates a simulation result of a transfer characteristic from Vi to Vo of the oscillator circuit illustrated in FIG. 14.

FIG. 17 illustrates a simulation result of the transfer characteristic from Vi to Vo of the oscillator circuit 200a. In this embodiment, the resonance frequency of the first resonator 5a is 11.0000 MHz and the resonance frequency of the second resonator 6a is 11.0592 MHz. The dotted line illustrates the characteristic in the case where the oscillator circuit 200a includes the first resonator 5a and the first negative capacitance circuit 7a but does not include the second resonator 6a and the second negative capacitance circuit 8a. The chain line illustrates the characteristic in the case where the oscillator circuit 200a includes the second resonator 6a and the second negative capacitance circuit 8a but does not include the first resonator 5a and the first negative capacitance circuit 7a. The solid line illustrates the characteristic in the case where the oscillator circuit 200a includes the first resonator 5a, the first negative capacitance circuit 7a, the second resonator 6a, and the second negative capacitance circuit 8a.

As illustrated by the dotted line, in the case where the oscillator circuit 200a includes the first resonator 5a and the first negative capacitance circuit 7a but does not include the second resonator 6a and the second negative capacitance circuit 8a, the impedance $Z_1$ becomes local minimum at the resonance frequency of the first resonator 5a. Additionally, as illustrated by the chain line, in the case where the oscillator circuit 200a includes the second resonator 6a and the second negative capacitance circuit 8a but does not include the first resonator 5a and the first negative capacitance circuit 7a, the impedance $Z_2$ becomes local minimum at the resonance frequency of the second resonator 6a. Accordingly, in these cases, the amount of the negative feedback of the inverting amplifier 2a becomes large and the gain of the transfer function Vo/Vi becomes small. Thus, the oscillation condition of the oscillator circuit 200a is not satisfied.

In contrast, in the case where the oscillator circuit 200a includes the first resonator 5a, the first negative capacitance circuit 7a, the second resonator 6a, and the second negative capacitance circuit 8a, the peak gain of approximately 1 appears at the frequency from the resonance frequency of the first resonator 5a to the resonance frequency of the second resonator 6a. At this frequency, the phase is changed by 180 degrees. As a result, the oscillation condition of the oscillator circuit 200a is satisfied.

Figure 18:
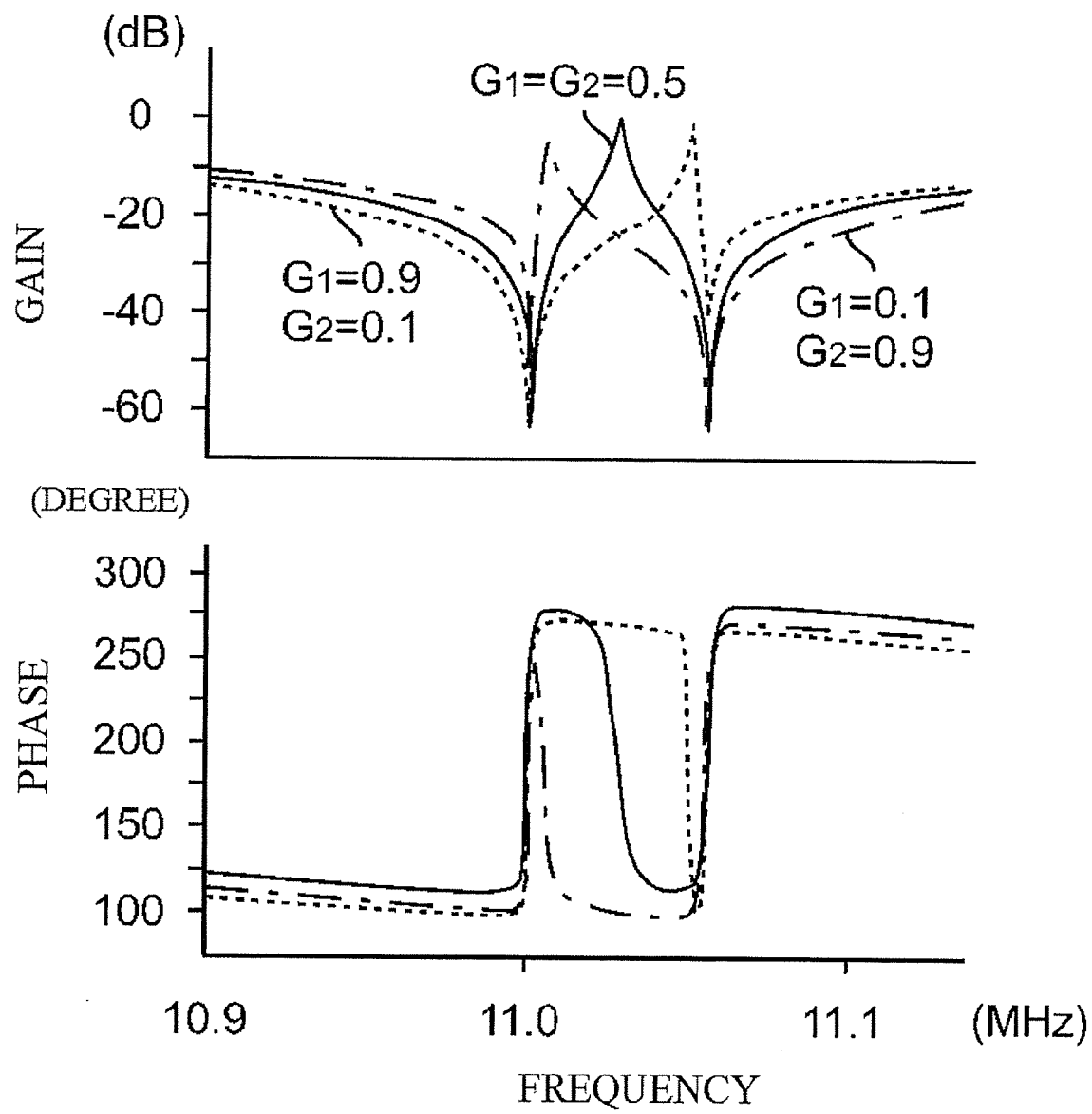
FIG. 18 illustrates a simulation result of a transfer characteristic from Vi to Vo of the oscillator circuit illustrated in FIG. 14.

FIG. 18 illustrates a simulation result of the transfer characteristic of the oscillator circuit 200a from Vi to Vo in the case where the respective gains of the third amplifier 3a and the fourth amplifier 4a are changed. In FIG. 18, the solid line illustrates the characteristic in the case where the gain $G_1$ of the third amplifier 3a and the gain $G_2$ of the fourth amplifier 4a are adjusted to 0.5 times. The dotted line illustrates the characteristic in the case where adjustment is performed to obtain $G_1$=0.9 times and $G_2$=0.1 times. The chain line illustrates the characteristic in the case where adjustment is performed to obtain $G_1$=0.1 times and $G_2$=0.9 times. According to FIG. 18, the finding is as follows. Adjusting the gain of the third amplifier 3a and the gain of the fourth amplifier 4a allows controlling the frequency at which the gain of the transfer characteristic becomes maximum and the frequency at which the phase is changed by 180 degrees.

As described above, with the oscillator circuit 200a, cancelling the respective equivalent parallel capacitances of the first resonator 5a and the second resonator 6a eliminates the influence of the anti-resonance frequency so as to cause oscillation in the wide frequency range between the resonance frequency of the first resonator 5a and the resonance frequency of the second resonator 6a. For example, the example illustrated in FIG. 18 ensures the frequency pulling range of ±2000 ppm or more.

Figure 19:
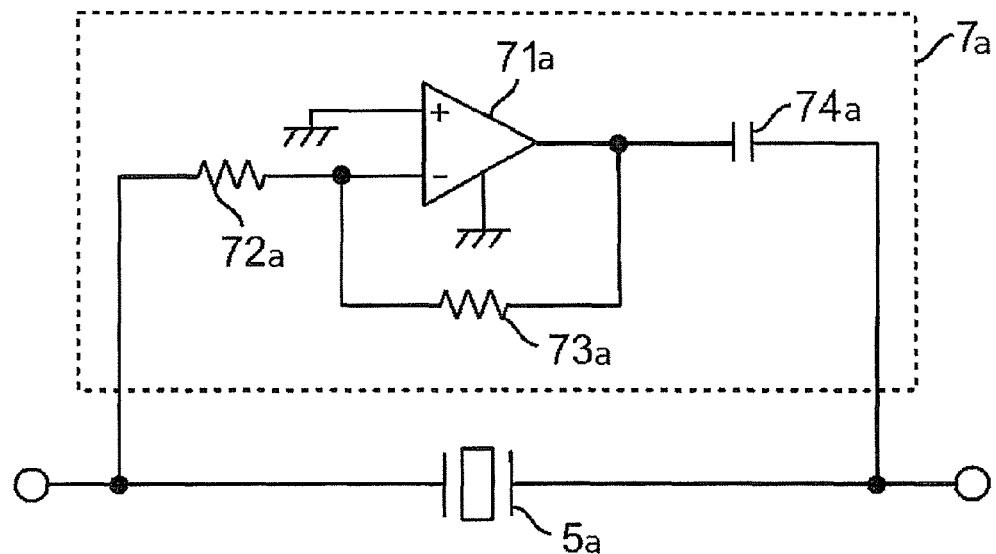
FIG. 19 illustrates a configuration example of a first negative capacitance circuit.

FIG. 19 illustrates a configuration example of the first negative capacitance circuit 7a. The first negative capacitance circuit 7a includes an operational amplifier 71a, a resistor 72a, a resistor 73a, and a capacitor 74a. The operational amplifier 71a functions as an inverting amplifier whose non-inverting input terminal connects to the ground. The inverting input terminal of the operational amplifier 71a connects to the first terminal of the first resonator 5a via the resistor 72a, and connects to the output terminal of the operational amplifier 71a via the resistor 73a. The output terminal of the operational amplifier 71a connects to a second terminal of the first resonator 5a via the capacitor 74a. The operational amplifier 71a generates a signal in reverse phase to the signal input from the inverting input terminal, and inputs the generated signal to the capacitor 74a.

The capacitor 74a connects to the second terminal of the first resonator 5a and the operational amplifier 71a. The capacitor 74a has a capacitance equal to that of the equivalent parallel capacitor of the first resonator 5a. The signal output from the operational amplifier 71a is a signal that has the same magnitude and a reverse phase with respect to those of the signal passing through the equivalent parallel capacitor of the first resonator 5a. This allows the first negative capacitance circuit 7a to cancel the influence by the equivalent parallel capacitor of the first resonator 5a.

Figure 20:
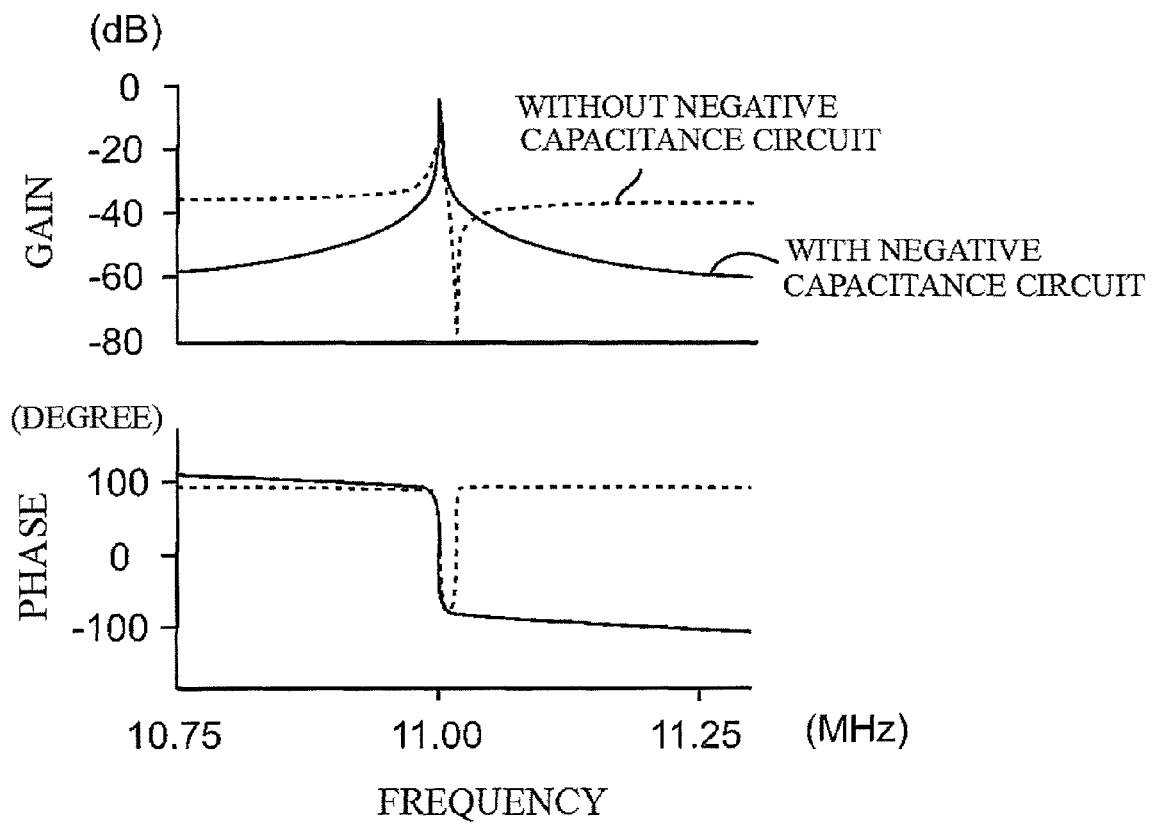
FIG. 20 illustrates simulation results of transfer characteristics in the cases where the first negative capacitance circuit illustrated in FIG. 19 is connected and is not connected.

FIG. 20 illustrates simulation results of the transfer characteristic of the first resonator 5a in the cases where the first negative capacitance circuit 7a illustrated in FIG. 19 is connected and is not connected. The dotted line illustrates the transfer characteristic of the first resonator 5a in the case where the first negative capacitance circuit 7a is not connected. The solid line illustrates the transfer characteristic of the first resonator 5a in the case where the first negative capacitance circuit 7a is connected in parallel to the first resonator 5a. The first resonator 5a has the minimum impedance at the resonance frequency of the first resonator 5a and has the maximum impedance at the anti-resonance frequency of the first resonator 5a. Accordingly, in the transfer characteristic of the single first resonator 5a in a state where the first negative capacitance circuit 7a is not connected, as illustrated by the dotted line in FIG. 20, there are the peak at which the gain becomes maximum at the resonance frequency and the bottom at which the gain becomes minimum at the anti-resonance frequency.

In contrast, in a state where the first negative capacitance circuit 7a is connected, as illustrated by the solid line in FIG. 20, the reduction in gain occurring at the anti-resonance frequency of the first resonator 5a disappears and the peak occurring at the resonance frequency appears alone. As a result, in the oscillator circuit 200a allows changing the oscillation frequency in the wide frequency range between the resonance frequency of the first resonator 5a and the resonance frequency of the second resonator 6a without being affected by the anti-resonance frequency of the first resonator 5a.

Here, the configuration of the first negative capacitance circuit 7a is not limited to the configuration illustrated in FIG. 19. For example, a floating negative capacitance circuit in another configuration described in A. Antoniou, "Floating Negative-Impedance Converters," IEEE Transactions on Circuit Theory, vol. 19, pp. 209-212, March 1972 may be used.

As described above, according to the oscillator circuit 200a according to the fifth embodiment, the first negative capacitance circuit 7a is disposed in parallel to the first resonator 5a. This allows changing the oscillation frequency in the wide frequency range between the resonance frequency of the first resonator 5a and the resonance frequency of the second resonator 6a without being affected by the anti-resonance frequency of the first resonator 5a.

Sixth Embodiment

Figure 21:
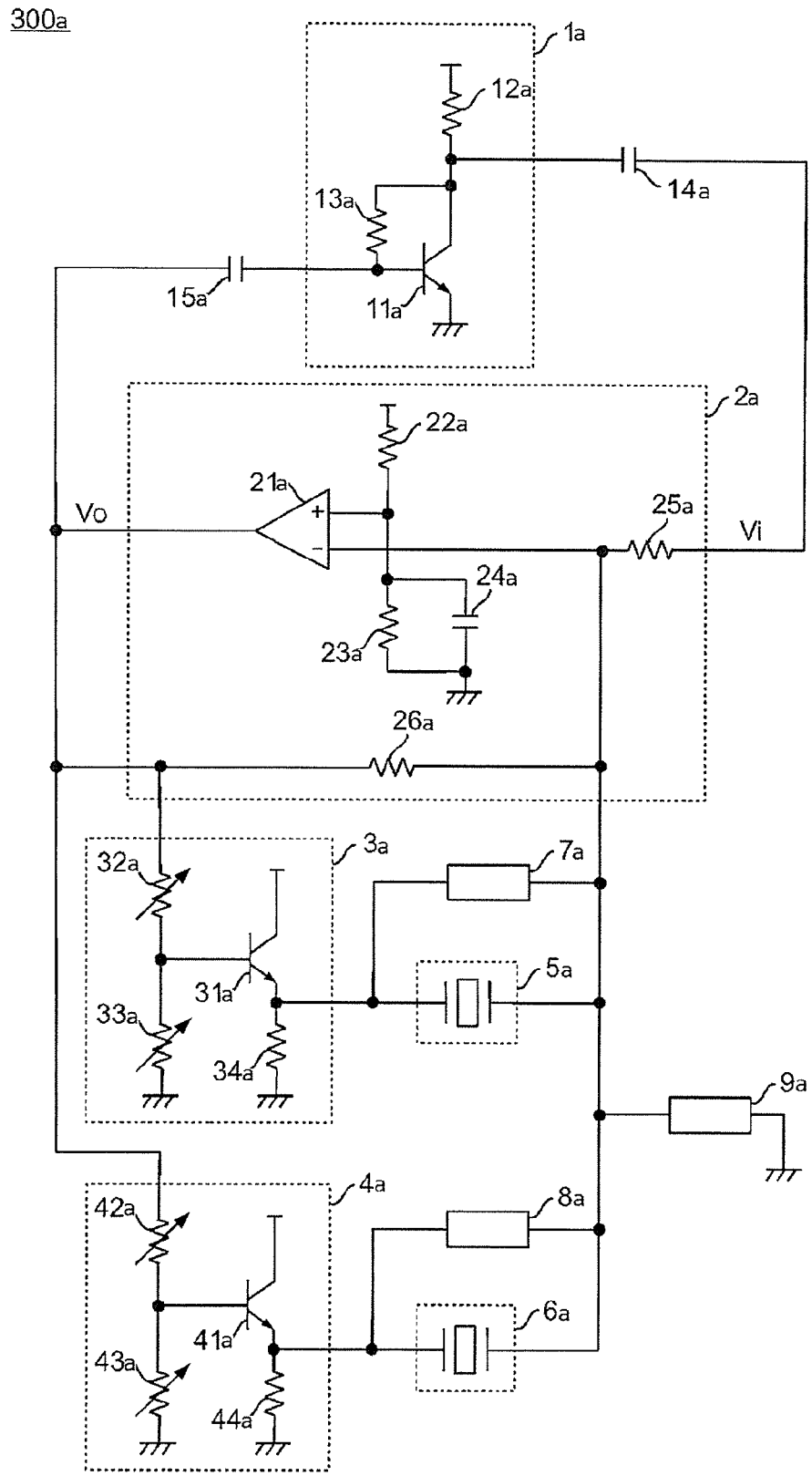
FIG. 21 illustrates a configuration example of an oscillator circuit according to a sixth embodiment.

FIG. 21 illustrates a configuration example of an oscillator circuit 300a according to a sixth embodiment. In the oscillator circuit 100a illustrated in FIG. 11 and the oscillator circuit 200a illustrated in FIG. 14, the output signal of the first amplifier 1a returns to the input side of the first amplifier 1a through the path in which the inverting amplifier 2a is disposed, the path in which the first resonator 5a is disposed, and the path in which the second resonator 6a is disposed. Accordingly, the oscillation condition is satisfied. However, in the actual circuit, the undesired oscillation may occur at a frequency other than the desired oscillation frequency by the influence of the path that is not illustrated in the circuit diagram due to the influence of the floating capacitance that is not illustrated in FIG. 11 or FIG. 14.

Therefore, to prevent the undesired oscillation, the oscillator circuit 300a further includes a third negative capacitance circuit 9a disposed between the inverting input terminal of the second amplifier 21a and the ground. The oscillator circuit 300a is otherwise similar to the oscillator circuit 200a illustrated in FIG. 14.

The value of the negative capacitance of the third negative capacitance circuit 9a is C=−2 (C01+C02). Here, C01 denotes the value of the parallel capacitance of the first resonator 5a. C02 denotes the value of the parallel capacitance of the second resonator 6a. Designing the negative capacitance of the third negative capacitance circuit 9a as described above reduces the influence on the transfer characteristic by the respective parallel capacitances of the first resonator 5a and the second resonator 6a. As a result, this eliminates the peak and the phase rotation of the gain occurring due to the resonance between the parallel capacitances, the equivalent series resistors, equivalent series inductors, and equivalent series capacitors in the first resonator 5a and the second resonator 6a, thus preventing undesired oscillations.

Figure 22:
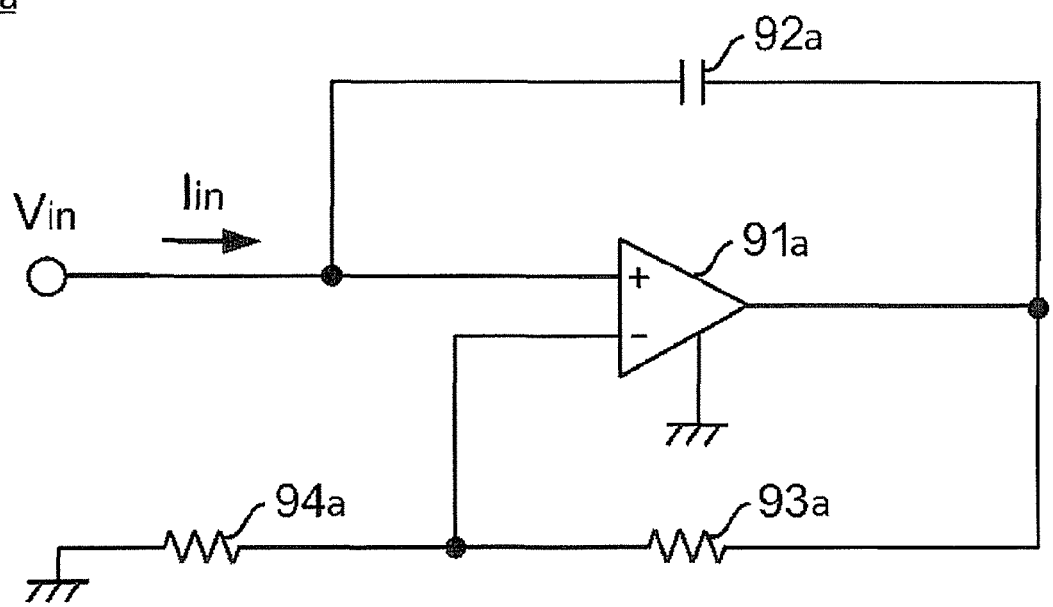
FIG. 22 illustrates a configuration example of a third negative capacitance circuit.

FIG. 22 illustrates a configuration example of the third negative capacitance circuit 9a. The third negative capacitance circuit 9a includes an operational amplifier 91a, a capacitor 92a, a resistor 93a, and a resistor 94a. The non-inverting input terminal of the operational amplifier 91a connects to the first resonator 5a and the second resonator 6a. The capacitor 92a is disposed between the non-inverting input terminal and the output terminal of the operational amplifier 91a. The resistor 93a is disposed between the inverting input terminal and the output terminal of the operational amplifier 91a. The resistor 94a is disposed between the inverting input terminal of the operational amplifier 91a and the ground.

Assuming that the capacitance value of the capacitor 92a is $C_f$, the resistance value of the resistor 93a is made equal to the resistance value of the resistor 94a, and the gain of the operational amplifier 91a that functions as a non-inverting amplifier is doubled, the admittance $Y_m$ where the third negative capacitance circuit 9a is viewed from the input is expressed by the following formula.

$$Y_m = \frac{I_{in}}{V_{in}} \Big/ -j\omega C_f \frac{A-2}{A+2} \approx -j\omega C_f \qquad \text{Formula (4)}$$

Here, $I_{in}$ is an input current to the non-inverting input terminal of the operational amplifier 91a, $V_{in}$ is an input voltage to the non-inverting input terminal of the operational amplifier 91a, and A is the open-loop gain of the operational amplifier 91a. When A is sufficiently large in the above-described formula, the configuration of the third negative capacitance circuit 9a allows obtaining the negative capacitance with the capacitance value approximately equal to $C_f$.

Figure 23:
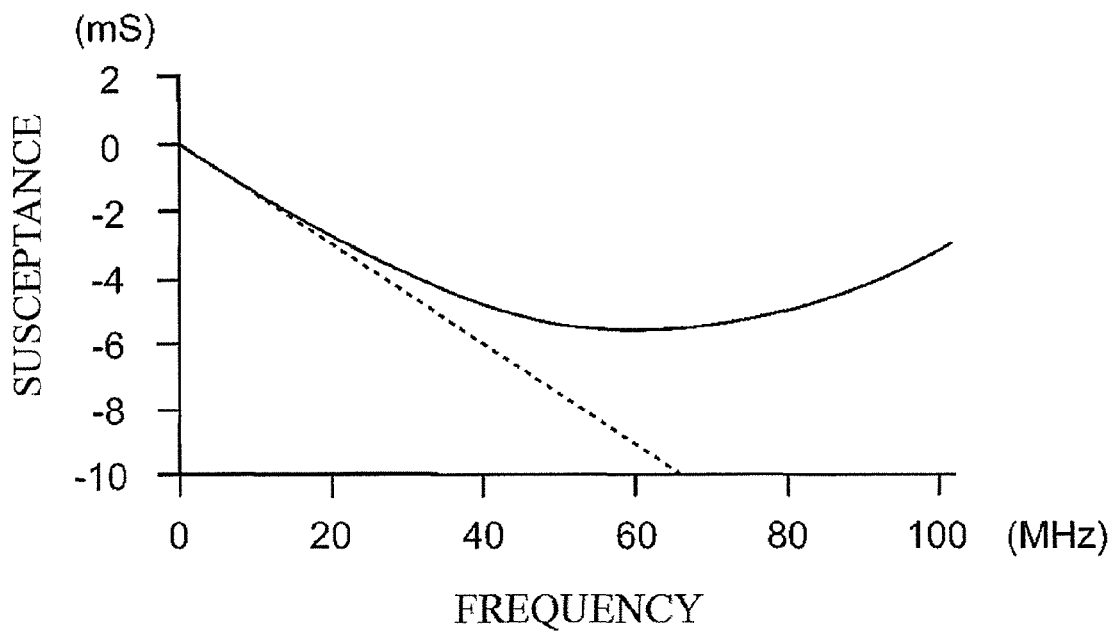
FIG. 23 illustrates a result of obtaining an imaginary component of an input admittance of the third negative capacitance circuit illustrated in FIG. 22 using a simulation.

FIG. 23 illustrates a result of obtaining the imaginary component of the input admittance of the third negative capacitance circuit 9a illustrated in FIG. 22 using a simulation. In FIG. 23, the vertical axis denotes the susceptance component of the third negative capacitance circuit 9a. FIG. 23 illustrates the state where the imaginary component is reduced as the frequency becomes larger in the third negative capacitance circuit 9a. The finding is as follows. The dotted line illustrates the asymptotic line of −jω×24 pF. At the frequency smaller than 20 MHz, approximately −$C_f$=−24 pF is realized. The oscillator circuit 300a with the third negative capacitance circuit 9a allows preventing undesired oscillations in the feedback path of the third amplifier 3a and the first resonator 5a and in the feedback path of the fourth amplifier 4a and the second resonator 6a.

Figure 24:
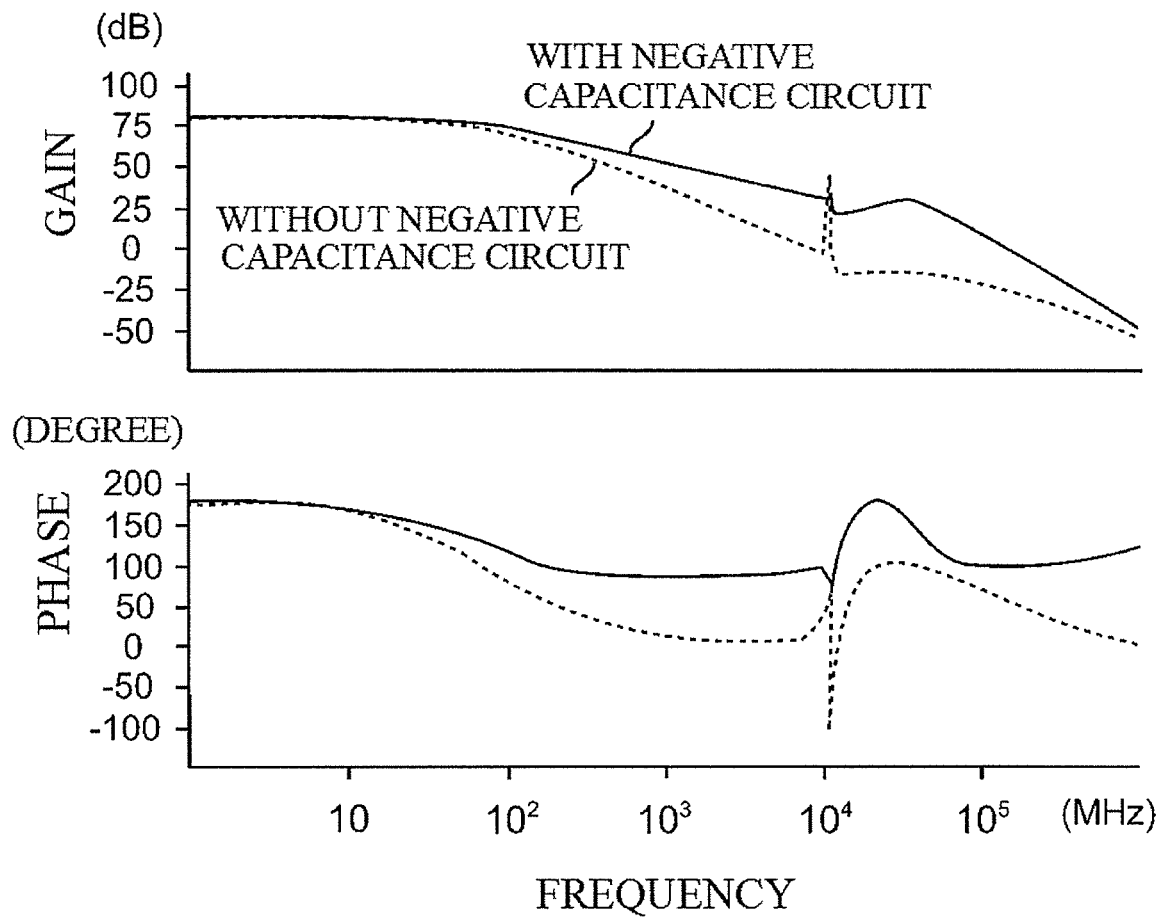
FIG. 24 illustrates open-loop characteristics of a single feedback path of the oscillator circuit illustrated in FIG. 21.
Figure 25:
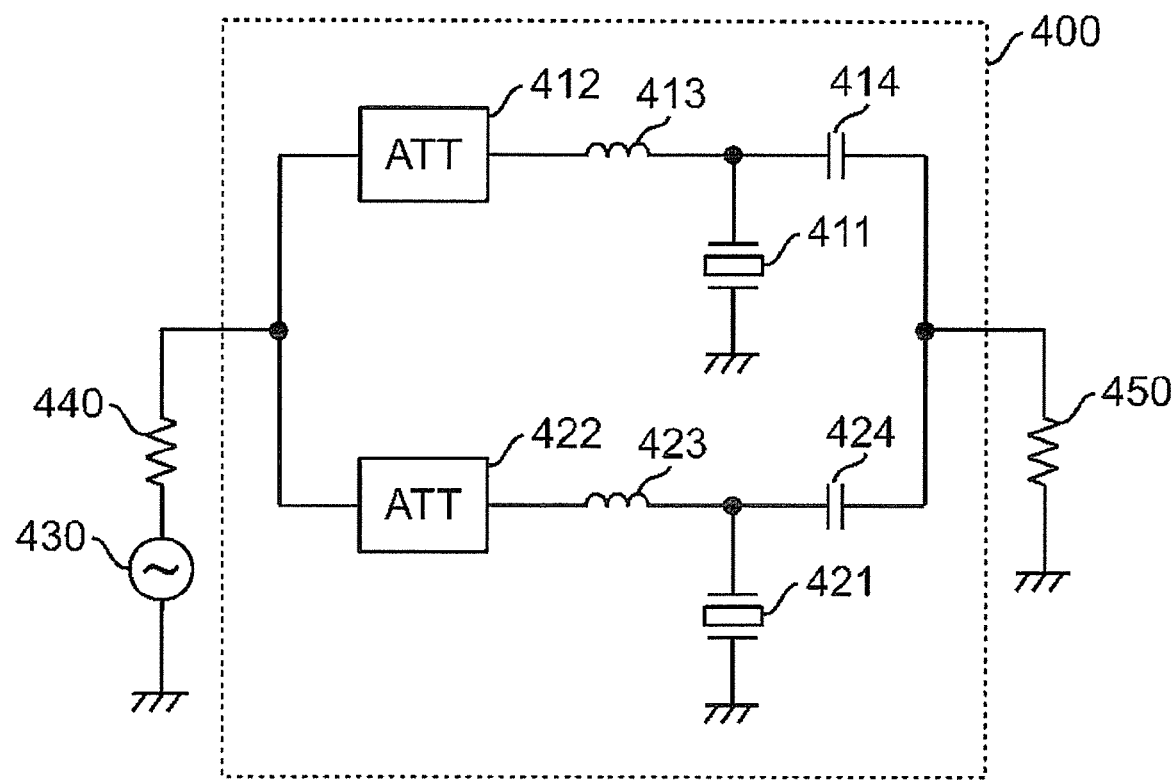
FIG. 25 illustrates a configuration example of a conventional anti-resonance circuit.

FIG. 24 illustrates the open-loop characteristic of a single feedback path of the oscillator circuit 300a. The dotted line illustrates the characteristic in the case where the third negative capacitance circuit 9a is not disposed. The solid line illustrates the characteristic in the case where the third negative capacitance circuit 9a is disposed. As illustrated by the dotted line, in the case where the third negative capacitance circuit 9a is not disposed, a rapid phase change intersecting with the phase of 0 occurs in the vicinity of the respective resonance frequencies of the first resonator 5a and the second resonator 6a. The condition under which undesired oscillations occur might be satisfied. In contrast, as illustrated in the solid line, in the case where the third negative capacitance circuit 9a is disposed, it is found that the rapid phase change in the vicinity of the respective resonance frequencies of the first resonator 5a and the second resonator 6a does not occur. The condition under which undesired oscillations occur is not satisfied. As a result, the oscillator circuit 300a allows changing the frequency in the wide frequency range without generating undesired oscillations.

The configuration of the third negative capacitance circuit 9a is not limited to the configuration illustrated in FIG. 22. The similar effect can be obtained by a negative capacitance circuit with another configuration. For example, as the third negative capacitance circuit 9a, the circuit described in R. L. Brennan, et al., "The CMOS Negative Impedance Converter," IEEE J. of Solid-State Circuits, vol. 23, No. 5, October 1988 or the circuit described in H. Mostafa, et al., "Novel Timing Yield Improvement Circuits for High-Performance Low-Power Wide Fan-In Dynamic OR Gates," IEEE Transactions on Circuits and Systems-I: Regular Papers, vol. 58, No. 8, August 2011 can be applied.

As described above, the oscillator circuit 300a according to the sixth embodiment further includes the third negative capacitance circuit 9a disposed between: the connection point between the first resonator 5a and the second amplifier 21a, and the ground. This prevents undesired oscillations and allows changing the frequency in the wide frequency range.

This disclosure is described with the embodiments. The technical scope of this disclosure is not limited to the above-described embodiments. Various modifications and improvements of the embodiments will become apparent to those skilled in the art. It is apparent that embodiments thus modified and improved are also within the technical scope of this disclosure according to the description of the claims.

For example, while in the above-described embodiment the configuration that includes the first resonator 5a and the second resonator 6a has been described, the configuration may include three or more resonators. Additionally, as the first resonator 5a and the second resonator 6a, not only a MEMS oscillator but also various oscillator circuits such as a crystal resonator, a ceramic resonator, a surface acoustic wave (SAW) filter, or an LC oscillator constituted of an inductor and a capacitor can be applied.

While in the above-described embodiment the examples using bipolar transistors have been described, field effect transistors may be used instead of the bipolar transistors. In this case, the collector of the bipolar transistor is substituted for the drain of the field effect transistor. The emitter of the bipolar transistor is substituted for the source of the field effect transistor. The base of the bipolar transistor is substituted for the gate of the field effect transistor.

The embodiment of this disclosure provides an oscillator circuit that includes a first amplifier, a second amplifier, a resistor, a first resonator, a third amplifier, a second resonator, and a fourth amplifier. The first amplifier amplifies a signal to be input. The second amplifier inversely amplifies an output signal of the first amplifier and inputs the inversely amplified output signal to the first amplifier. The resistor is connected between the input and the output of the second amplifier. The first resonator and the third amplifier are connected to each other in series while being connected in parallel to the resistor. The second resonator and the fourth amplifier are connected to each other in series while being connected in parallel to the resistor. The first resonator has an anti-resonance frequency different from an anti-resonance frequency of the second resonator. At least one of the third amplifier and the fourth amplifier has a variable gain. For example, the first resonator has a resonance frequency smaller than a resonance frequency of the second resonator while the first resonator has an anti-resonance frequency larger than the resonance frequency of the second resonator.

The above-described oscillator circuit may be configured as follows. The first resonator has a resonance frequency smaller than a resonance frequency of the second resonator. The oscillator circuit may further includes a first negative capacitance circuit disposed in parallel to the first resonator and has a capacitance with an opposite polarity to a polarity of an equivalent parallel capacitance of the first resonator. In this case, the resonance frequency and the anti-resonance frequency of the first resonator are, for example, smaller than the resonance frequency and the anti-resonance frequency of the second resonator.

The above-described first negative capacitance circuit includes, for example, an inverting amplifier and a first capacitor. The inverting amplifier connects to one terminal of the first resonator. The first capacitor connects to another terminal of the first resonator and to the inverting amplifier.

The above-described oscillator circuit may further include a third negative capacitance circuit disposed between the input terminal of the second amplifier and the ground.

The oscillator circuit according to this disclosure can be incorporated into an integrated circuit, and provides an effect for generating the oscillation signal that allows changing the oscillation frequency in a wide frequency range.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:
1. An oscillator circuit, comprising:
a first resonator;
a second resonator, having a frequency characteristic different from a frequency characteristic of the first resonator;
a frequency adjusting unit, being configured to change a ratio between a contribution of the first resonator and a contribution of the second resonator so as to adjust an output frequency,
wherein the frequency characteristic is a resonance frequency,
the frequency adjusting unit includes:
a first adjusting unit, being configured to adjust a first current value of a first current, the first current flows through a first path, the first path is connected to the first resonator;
a second adjusting unit, being configured to adjust a second current value of a second current, the second current flows through a second path, the second path is connected to the second resonator;
a converting unit, being configured to convert the first current and the second current into a voltage corresponding to the first current value and the second current value; and
an amplifying unit, being configured to amplify a voltage converted by the converting unit and apply the amplified voltage to the first resonator and the second resonator;
wherein the first adjusting unit includes a first transistor and a first variable resistor, the first transistor causing a flow of the first current, the first variable resistor being configured to adjust the first current value, and
the second adjusting unit includes a second transistor and a second variable resistor, the second transistor causing a flow of the second current, the second variable resistor being configured to adjust the second current value.

2. The oscillator circuit according to claim 1, wherein the frequency adjusting unit includes: a ratio adjusting unit,
the ratio adjusting unit is configured to adjust a ratio between the first current value and the second current value.

3. The oscillator circuit according to claim 2, wherein the first resonator connects in series to the first adjusting unit in the first path between the amplifying unit and the first adjusting unit,
the second resonator connects in series to the second adjusting unit in the second path between the amplifying unit and the second adjusting unit, and
an anti-resonance frequency of the first resonator and an anti-resonance frequency of the second resonator are higher than a resonance frequency of the first resonator and a resonance frequency of the second resonator.

4. The oscillator circuit according to claim 1, wherein the first resonator connects in series to the first adjusting unit in the first path between the amplifying unit and the first adjusting unit,
the second resonator connects in series to the second adjusting unit in the second path between the amplifying unit and the second adjusting unit, and
an anti-resonance frequency of the first resonator and an anti-resonance frequency of the second resonator are higher than a resonance frequency of the first resonator and a resonance frequency of the second resonator.

5. The oscillator circuit according to claim 1, wherein the first resonator connects in series to the first adjusting unit in the first path between the amplifying unit and the first adjusting unit, the second resonator connects to the second path and a ground, the second path being disposed between the amplifying unit and the second adjusting unit, and an anti-resonance frequency of the first resonator and a resonance frequency of the second resonator are frequencies between a resonance frequency of the first resonator and an anti-resonance frequency of the second resonator.

6. The oscillator circuit according to claim 2, wherein the first resonator connects in series to the first adjusting unit in the first path between the amplifying unit and the first adjusting unit, the second resonator connects to the second path and a ground, the second path being disposed between the amplifying unit and the second adjusting unit, and an anti-resonance frequency of the first resonator and a resonance frequency of the second resonator are frequencies between a resonance frequency of the first resonator and an anti-resonance frequency of the second resonator.

7. An oscillator circuit, comprising:

a first resonator;

a second resonator, having a frequency characteristic different from a frequency characteristic of the first resonator;

a frequency adjusting unit, being configured to change a ratio between a contribution of the first resonator and a contribution of the second resonator so as to adjust an output frequency, wherein the frequency characteristic is a resonance frequency, the frequency adjusting unit includes:

a first adjusting unit, being configured to adjust a first current value of a first current, the first current flows through a first path, the first path is connected to the first resonator;

a second adjusting unit, being configured to adjust a second current value of a second current, the second current flows through a second path, the second path is connected to the second resonator;

a converting unit, being configured to convert the first current and the second current into a voltage corresponding to the first current value and the second current value; and an amplifying unit, being configured to amplify a voltage converted by the converting unit and apply the amplified voltage to the first resonator and the second resonator;

wherein the first resonator connects in series to the first adjusting unit in the first path between the amplifying unit and the first adjusting unit, the second resonator connects in series to the second adjusting unit in the second path between the amplifying unit and the second adjusting unit, and an anti-resonance frequency of the first resonator and an anti-resonance frequency of the second resonator are higher than a resonance frequency of the first resonator and a resonance frequency of the second resonator.

8. An oscillator circuit, comprising:

a first resonator;

a second resonator, having a frequency characteristic different from a frequency characteristic of the first resonator;

a frequency adjusting unit, being configured to change a ratio between a contribution of the first resonator and a contribution of the second resonator so as to adjust an output frequency, wherein the frequency characteristic is an anti-resonance frequency, the frequency adjusting unit includes:

a first amplifier, being configured to amplify a signal to be input;

a second amplifier, being configured to inversely amplify an output signal of the first amplifier and input the inversely amplified output signal to the first amplifier;

a resistor, being connected between an input and an output of the second amplifier;

a third amplifier, being connected in series to the first resonator and connected in parallel to the resistor; and a fourth amplifier, being connected in series to the second resonator and connected in parallel to the resistor, wherein at least one of the third amplifier and the fourth amplifier has a variable gain.

9. The oscillator circuit according to claim 8, wherein the first resonator has a resonance frequency smaller than a resonance frequency of the second resonator, and the first resonator has an anti-resonance frequency larger than the resonance frequency of the second resonator.

10. The oscillator circuit according to claim 8, wherein the first resonator has a resonance frequency smaller than a resonance frequency of the second resonator, and the frequency adjusting unit includes a first negative capacitance circuit disposed in parallel to the first resonator, the first negative capacitance circuit having a capacitance with an opposite polarity to a polarity of an equivalent parallel capacitance of the first resonator.

11. The oscillator circuit according to claim 10, wherein a resonance frequency and an anti-resonance frequency of the first resonator are smaller than a resonance frequency and an anti-resonance frequency of the second resonator.

12. The oscillator circuit according to claim 10, wherein the first negative capacitance circuit includes an inverting amplifier and a first capacitor, the inverting amplifier is connected to one terminal of the first resonator, the first capacitor is connected to another terminal of the first resonator and to the inverting amplifier.

13. The oscillator circuit according to claim 11, wherein the first negative capacitance circuit includes an inverting amplifier and a first capacitor, the inverting amplifier is connected to one terminal of the first resonator, the first capacitor is connected to another terminal of the first resonator and to the inverting amplifier.

14. The oscillator circuit according to claim 10, wherein the frequency adjusting unit includes a third negative capacitance circuit disposed between an input terminal of the second amplifier and a ground.

15. The oscillator circuit according to claim 11, wherein the frequency adjusting unit includes a third negative capacitance circuit disposed between an input terminal of the second amplifier and a ground.

16. The oscillator circuit according to claim 12, wherein the frequency adjusting unit includes a third negative capacitance circuit disposed between an input terminal of the second amplifier and a ground.

* * * * *